United States Patent [19]

Lang et al.

[11] Patent Number: 5,337,328
[45] Date of Patent: Aug. 9, 1994

[54] SEMICONDUCTOR LASER WITH BROAD-AREA INTRA-CAVITY ANGLED GRATING

[75] Inventors: Robert J. Lang, Pleasanton; Kenneth M. Dzurko, Santa Clara; Donald R. Scifres, San Jose; David F. Welch, Menlo Park, all of Calif.

[73] Assignee: SDL, Inc., San Jose, Calif.

[21] Appl. No.: 97,682

[22] Filed: Jul. 27, 1993

Related U.S. Application Data

[63] Continuation-in-part of Ser. No. 880,681, May 8, 1992, Pat. No. 5,231,642.

[51] Int. Cl.$^5$ .............................................. H01S 3/19
[52] U.S. Cl. .................................... 372/45; 372/96; 372/102; 372/99
[58] Field of Search .................. 372/45, 96, 102, 99

[56] References Cited

U.S. PATENT DOCUMENTS 4,658,403  4/1987  Takiguchi et al. .................. 372/96
5,103,456  4/1992  Scifres et al. ........................ 372/50

FOREIGN PATENT DOCUMENTS 0010882  1/1983  Japan .................................. 372/96
0030754  7/1983  Japan .................................. 372/96
0158377  7/1987  Japan .................................. 372/96

Primary Examiner—Georgia Y. Epps
Attorney, Agent, or Firm—Schneck & McHugh

[57] ABSTRACT

A semiconductor laser includes a grating that is disposed at an angle to cavity reflectors to coherently diffract a beam of light along a path that is at least partially laterally directed within the cavity. The grating period and orientation are selected such that a specified wavelength of the light beam propagating along the path will resonate for light that impinges upon the end reflectors at normal incidence. By keeping the angle of incidence of the light beam upon the grating greater than about 45 degrees, reflectivity of the grating is maximized and the required grating period is larger thereby simplifying the fabrication of the grating.

85 Claims, 12 Drawing Sheets

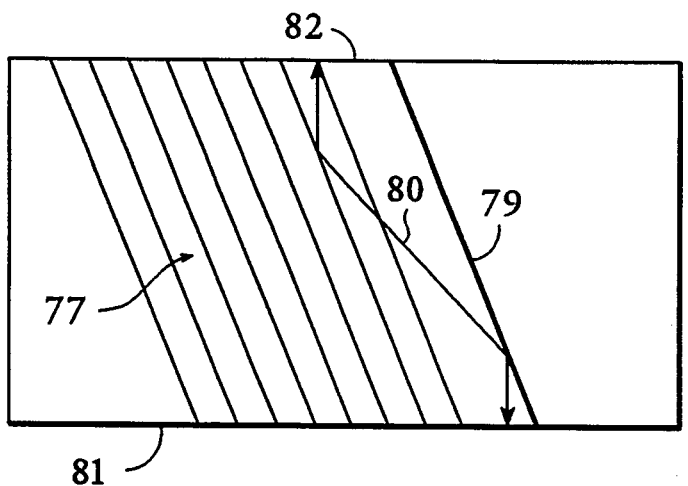
FIG. 5d
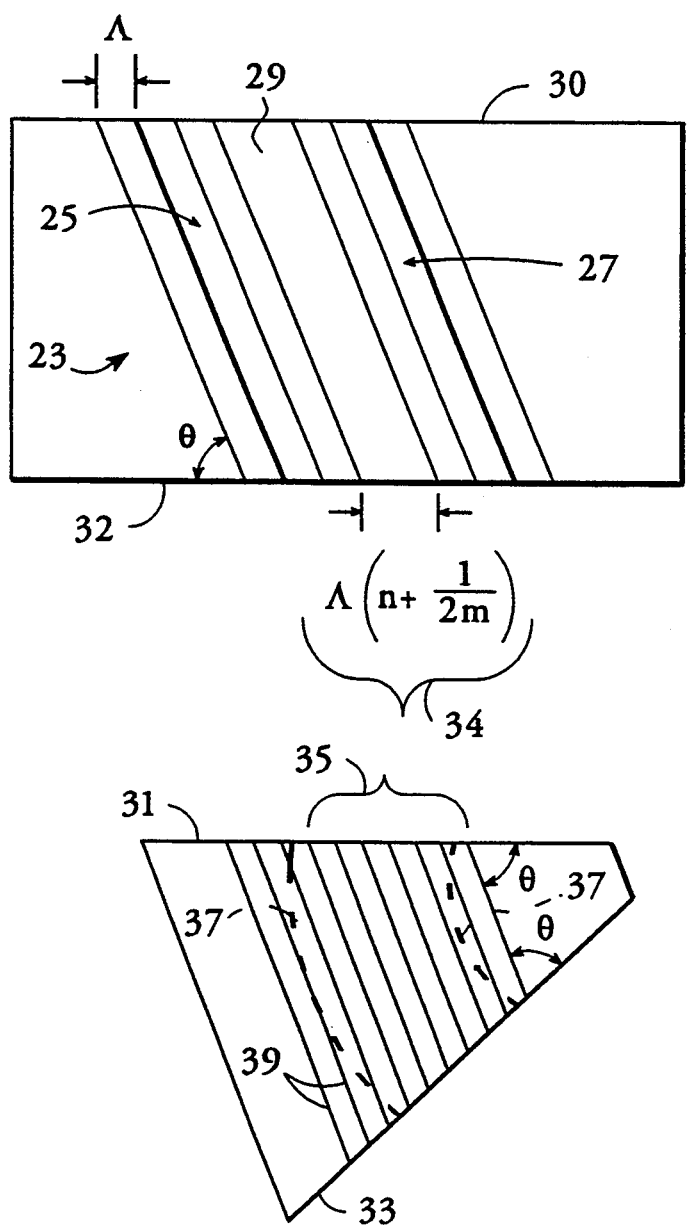
FIG. 6
FIG. 7a

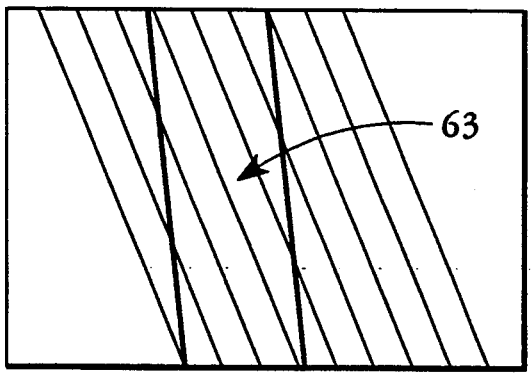
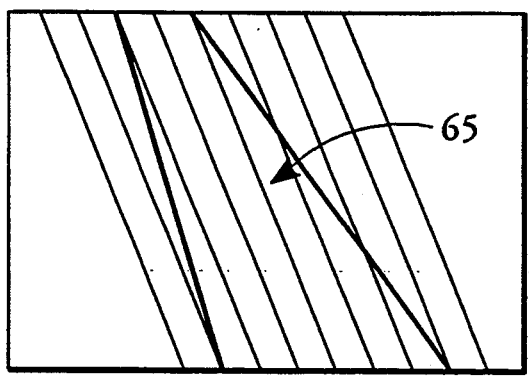
FIG. 9c    FIG. 9d
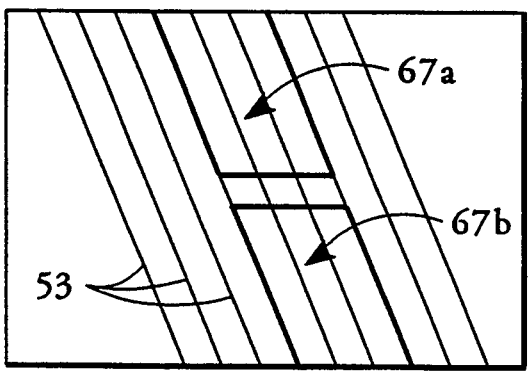
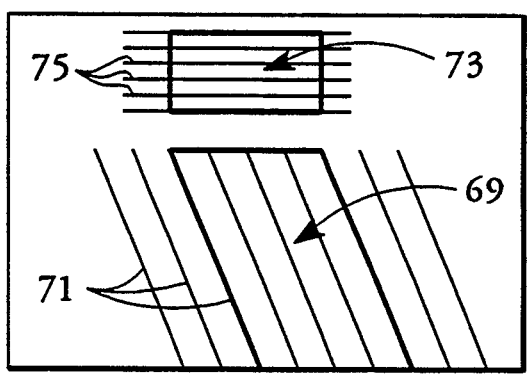
FIG. 9e    FIG. 9f
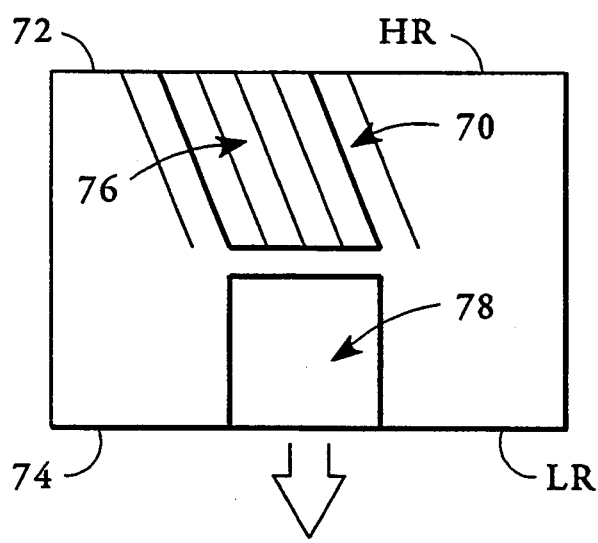
FIG. 10

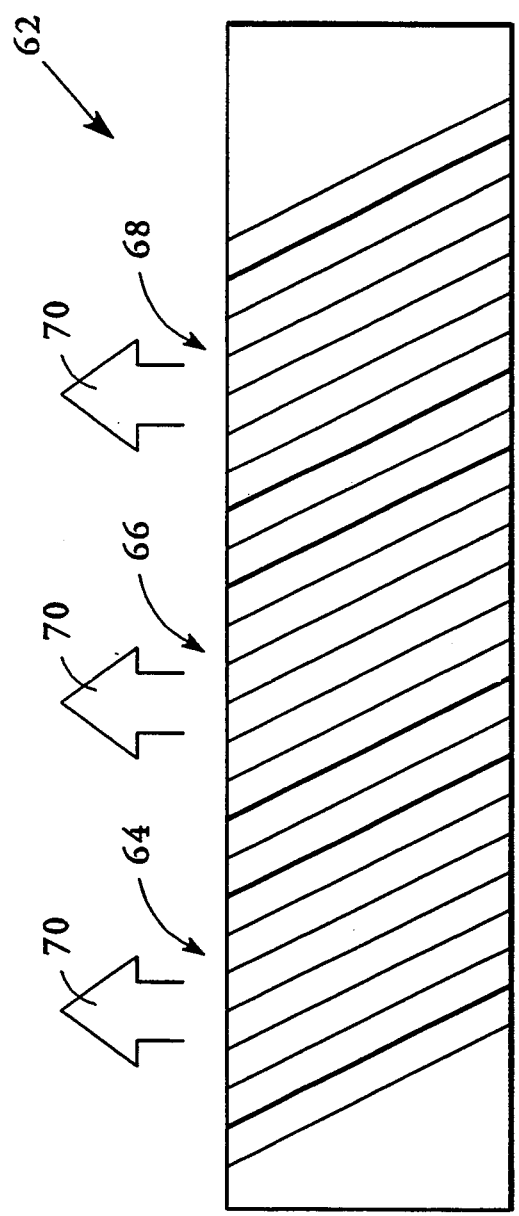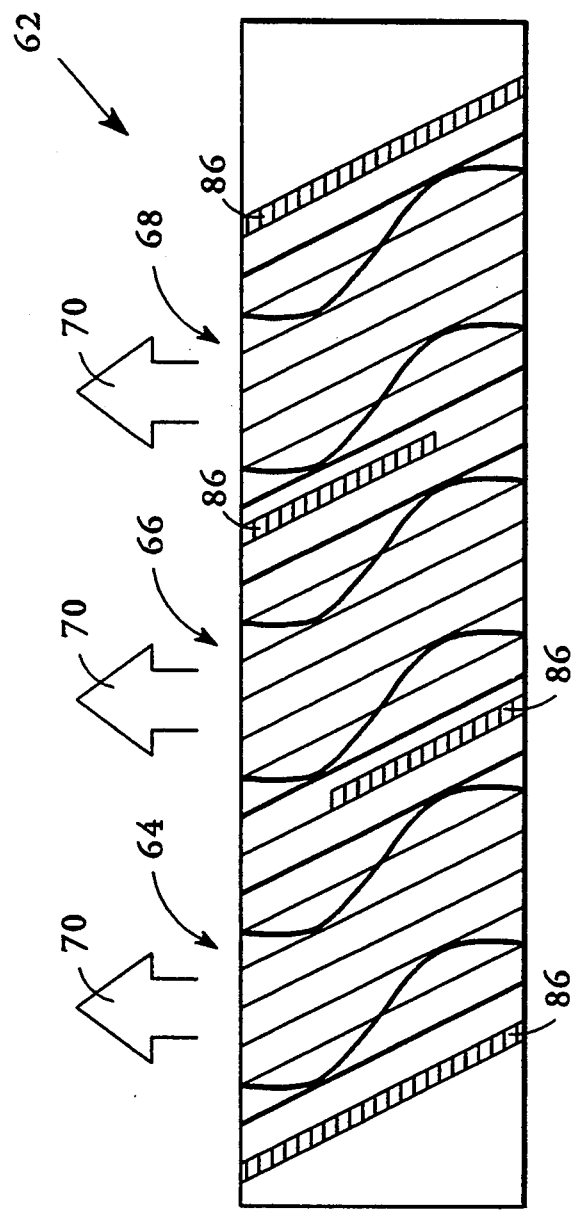
FIG. 13a
FIG. 13b

SEMICONDUCTOR LASER WITH BROAD-AREA INTRA-CAVITY ANGLED GRATING

STATEMENT AS TO RIGHTS TO INVENTIONS MADE UNDER FEDERALLY SPONSORED RESEARCH AND DEVELOPMENT

This invention was made with government support under contract no. F29601-91-C-0012 awarded by the Department of the Air Force. The government has certain rights in the invention.

CROSS-REFERENCE TO RELATED APPLICATIONS

This is a continuation-in-part of application Ser. No. 07/880,681, filed May 8, 1992, now U.S. Pat. No. 5,231,642, issued Jul. 27, 1993.

TECHNICAL FIELD

The present invention pertains to the field of broad area semiconductor lasers. Specifically, the present invention pertains to such broad area semi-conductor lasers and laser arrays as include one or more gratings within the resonant cavity of those lasers.

BACKGROUND ART

Broad area lasers include a broad area gain region within at least a portion of the resonant cavity of the laser, instead of having only a narrow single spatial mode waveguide that extends over the entire length of the cavity, and thus is capable of achieving higher output power than conventional single mode lasers. The broad area gain region, with a width greater than about 5 $\mu$m, is capable of supporting multiple spatial modes of propagation, with the light generally propagating freely within the broad area gain region, any wave-guiding of the light, such as from gain guiding effects of current injection, usually being incidental. Thus, if actual operation of a broad area laser in a single spatial mode is desired, then some other mechanism, such as a single mode waveguide spatial filter, must also be supplied to the laser structure in order to select the desired spatial mode.

In semiconductor lasers, the gain characteristics of a laser's active medium combined with the characteristics of the laser's resonant optical cavity frequently permit the laser oscillation of any one of several possible longitudinal modes, each mode corresponding to a different wavelength of the light output from the laser. Unfortunately, which particular mode or combination of modes lases at any particular moment may depend on factors such as the temperature of the laser and the amount of current injected into the laser's active medium, so that the laser can "hop" from one longitudinal mode to another during operation as those conditions change, for example, when directly modulating the laser. Semiconductor lasers that are susceptible to such longitudinal mode hopping are unsuitable for many applications requiring single frequency outputs, such as fiberoptic communications.

In addition to the many possible longitudinal modes, broad area lasers may also operate in any one of several transverse or spatial modes. Unfortunately, the spatial modes generated within the optical cavity are not necessarily mutually coherent. As the light generated by the laser active medium propagates along a path within the optical cavity and increases in light intensity, multiple independent light filaments may be created. The free carrier density at the center of each filament is decreased as a result of the increased intensity along the path of the light filament. This decrease in charge density causes an increase in the refractive index at the center of the mode resulting in the formation of a stable waveguide for the filament. Unfortunately, each filament is stable only within itself and may not be coherent with other regions of the broad area laser. As with numerous longitudinal modes, the filamentary laser light resulting from the generation of more than one spatial mode makes the resultant output beam unsuitable for many commercial uses.

Some broad area semiconductor lasers include a grating within the optical cavity. The grating is tuned such that feedback in the optical cavity occurs only for light of a particular wavelength. However, light of differing wavelengths may still resonate within the cavity due to effects such as parasitic Fabry-Perot oscillation. Additionally, numerous spatial modes may still occur in such systems.

In U.S. Pat. No. 5,103,456, Scifres et al. describe a master oscillator power amplifier (MOPA) device with a broad beam output. An angled grating in the device couples light unidirectionally from a single transverse mode laser oscillator into a broad area amplifier laterally disposed relative to the oscillator's waveguide. The laser oscillator typically has a 1-5 $\mu$m wide real refractive index waveguide that supports a single spatial mode at least to moderate power levels (tens of milliwatts) and preferably up to 100 mW. The amplifier has a width of 1-10 mm and boosts the optical power over a length of about 0.5-4 mm to about 1200 mW-2500 mW. The angled grating is oriented to minimize feedback from the amplifier into the laser oscillator.

In U.S. Pat. No. 4,658,403, Takiguchi et al. describe a diode laser in which a grating is used to optically couple two offset waveguides. Light generated in one of the waveguides, and having a particular wavelength, is reflected by the grating into the other waveguide. In so doing, Takiguchi et al. attempt to suppress unwanted oscillations of light.

It is an object of this invention to provide a broad area semiconductor laser which is able to generate a coherent single wavelength and single spatial mode beam without producing mutually incoherent light filaments.

It is a further object of the present invention to provide a broad area semiconductor laser which is suitable for use in a monolithic array of semiconductor lasers.

It is still another object of the present invention to provide a broad area semiconductor laser which can be used in a master oscillator power amplifier (MOPA) to produce a coherent high power output beam.

SUMMARY OF THE INVENTION

These objects have been achieved with a broad area semiconductor laser in which an angled grating directs laser light along a path between two end reflectors to produce a coherent beam of light having a specific wavelength and a single spatial mode. This is accomplished by placing a periodic structure, such as a grating with its grooves disposed at a non-normal angle to the end reflectors. The grating pitch is selected to resonate light of a specific wavelength propagating over a broad area along paths between the two reflective ends while it passes or transmits light of differing wavelengths into a light absorptive or non-transmissive region. The light directed from the grating impinges upon the reflective ends at normal incidence. Additionally, the orientation of the grating is preferably such that light propagating in the broad area impinges the grating teeth at an angle of incidence of greater than about 45 degrees. In so doing, greater reflectivity is achieved and a larger grating pitch can be used, thereby simplifying the fabrication of the grating.

A single mode selection waveguide may be used as a spatial mode filter. The single mode selection waveguide is optically coupled to an end of the grating region such that only a single spatial mode of the selected wavelength oscillates in the optical cavity.

Gratings, as used here, include any periodic structure or collection of periodic structures such as etched grooves, periodic index variations, antiguides, dielectric stacks and periodic gain or loss distributions. One or more phase shifts totaling a quarter wavelength over the width of the pumped gain region may be incorporated into the grating. The gratings may be arranged entirely within a pumped gain region of the laser, may bound the pumped gain region, or may extend over an area that includes both all or part of the pumped gain region and neighboring regions bounding the pumped gain region of the laser. The pumped gain region may be defined by a conductive contact stripe on the laser surface that generally coincides with the expected or desired light intensity envelope for light propagating within the cavity. In general, such a stripe would not be a straight contact aligned perpendicular to the end reflectors. Rather, because of the broad area angled grating region in the cavity, the stripes are serpentine or tilted with respect to the end reflectors and can also be flared. Multiple contacts for non-uniform pump distribution are also possible.

In another embodiment of the invention, a wavelength-tuned source can be achieved by tuning the equivalent refractive index of a region beneath a grating that provides feedback to the laser cavity. In yet another embodiment, the laser can be modulated by tuning the equivalent refractive index of a grating region in and out of resonance with another grating region.

In yet another embodiment of the present invention, the light output from the broad area laser cavity is fed into an optical power amplifier for yet higher power output and more efficient coherent operation.

In yet another embodiment, broad area semiconductor lasers of the present invention are arranged in an array to produce a larger coherent output beam.

BRIEF DESCRIPTION OF THE DRAWINGS

FIGS. 5a–d, 6, 7a–f, 8, 9a–f and 10 are top plan views of alternate embodiments of broad area serpentine semiconductor lasers in accord with the present invention.

FIGS. 13a, 13b, 14a, and 14b are top plan views of monolithic arrays of the broad area serpentine semiconductor lasers of FIG. 1 in accord with the present invention.

BEST MODE FOR CARRYING OUT THE INVENTION

Figure 1:
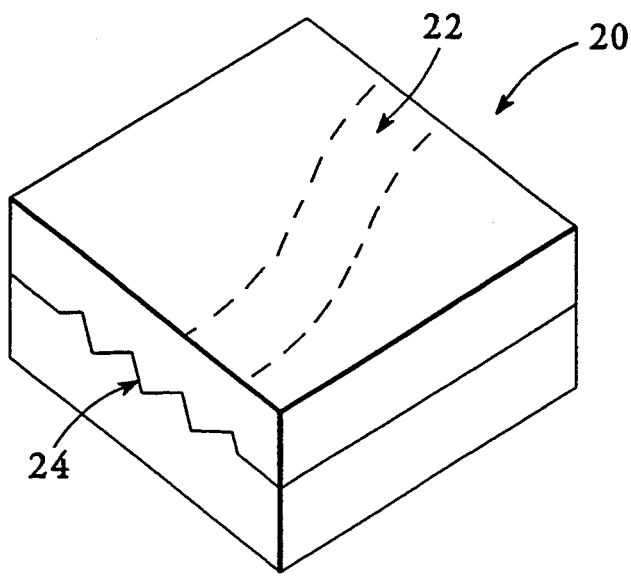
FIG. 1 is a perspective view of a broad area serpentine semiconductor laser in accord with the present invention.

With reference to FIG. 1, a perspective view of a broad area semiconductor laser structure 20 constructed according to the present invention, with an angled intracavity broad-area grating reflector for coherently diffracting a light beam along a tilted or serpentine path 22 is shown. For purposes of clarity, of the numerous structural features present in the laser 20, only the angled grating layer 24 is shown in FIG. 1. Like other semiconductor lasers, those of the present invention have a semiconductor material body with an active light emitting region near a p-n junction. Electrodes are usually formed on the top and bottom surfaces of the body to provide a forward electrical bias across the p-n junction in the active light emitting region. The electrical bias is applied through the active light emitting region at a current higher than a lasing threshold current density. Alternatively, the structure may be optically pumped, possibly in a configuration lacking a p-n junction, in similar fashion to well known optically pumped semiconductor lasers. The invention can also be applied to non-semiconductor guided-wave films, such as doped-glasses, nonlinear harmonic-generating materials, etc.

Lightwaves are thus generated and propagate in the active light emitting region. As is well known, the semiconductor material body can be formed having a homostructure, single heterostructure, or, preferably, a double heterostructure. The active region may be a single active layer, a single quantum well structure, or a multiple quantum well (MQW) structure. Strained-layer superlattice structures can also be used. Typically, the material composition is some combination of III-V compound semiconductors, such as GaAs/AlGaAs or InP/InGaAsP. However, other direct bandgap semiconductor materials may also be used. The laser structure, as described thus far, is completely conventional, encompassing all manner of known diode lasers.

Each of the semiconductor lasers, laser arrays, MOPAs or other light generating structures of the present invention, also has at least one distributed reflector, such as a periodic or quasi-periodic grating or dielectric stack, formed in the semiconductor material body. Gratings may be formed between two adjacent semiconductor layers of differing refractive indices or at an air-semiconductor interface on a surface of the body. Such gratings should be sufficiently close to the active light emitting region to interact with lightwaves propagating in the active region and neighboring layers. The degree of optical lightwave overlap, $\Gamma_g$, with the grating partially determines the effective reflectivity of the grating. Deeper grating teeth generally have higher reflectivity. Although gratings of the type having etched grooves are typical, other types of distributed reflectors having one or more sets of parallel, periodically spaced, partial reflectors are also contemplated. It is recognized that a "grating" is any structure having periodic or quasi-periodic partial reflectors, such as those produced by a spatial variation in the equivalent refractive index for light propagating in the grating region. Accordingly, the term "grating," as used here, includes but is not limited to those employing etched grooves, periodic index variations, antiguides, dielectric stacks, periodic gain distributions and periodic loss distributions.

Periodic gratings have a wavelength reflection response that satisfies the Bragg condition $2\Lambda\cos\theta = m\lambda_0/n_{eff}$, where $\Lambda$ is the tooth spacing or "pitch" of the grating, $\theta$ is the incidence angle that lightwaves make with respect to the normal to the grating teeth, m is an integer representing the diffraction order, $\lambda_0$ is the free space wavelength of the lightwaves and $n_{eff}$ is the effective refractive index in the grating region. Gratings may be of first order (m=1), second order (m=2) or possibly of some higher order (m>2). High order gratings will generally require a larger refractive index step at each reflector of the grating in order to have sufficient effective grating reflectivity for good operation.

Some gratings used in structures built according to the present invention may also incorporate one or more phase shifts to form a quasi-periodic tooth pattern with a dominant periodicity. Generally, such phase shifts total one quarter wavelength over the width of the pumped gain region. For example, a single quarter-wave phase shift or two spaced apart eighth-wave phase shifts might be incorporated into an otherwise periodic grating. Such quasi-periodic grating structures might also be thought of as two distinct periodic gratings that are disposed adjacent to one another. In any case, the reflection response of such gratings are essentially governed by the dominant periodicity of the structures, where the added phase shifts serve to modify the overall shape of the intensity distribution of the coherently diffracted beam.

Lightwaves impinging on a grating at an angle generally reflect light into different polarizations. Thus, the effective grating reflectivity within a lasing cavity is dependent on wavelength, angle of incidence, optical overlap of the lightwave with the grating and the polarization of the incident light. The gratings can be pumped with electrical current to minimize absorption of the lightwaves or to tune the grating's response to incident light.

Typically, a periodic stack of successive alternating higher and lower refractive index material layers is created on cleaved or ion milled facets in order to create either a low reflectivity, or anti-reflecting (AR), coated light emitting surface, or a high reflectivity (HR) coated mirror surface. Periodic partial reflections at the layer interfaces of the stack produce a reflection response to the incident light that depends on the thicknesses and refractive indices of the respective layers.

Figure 2:
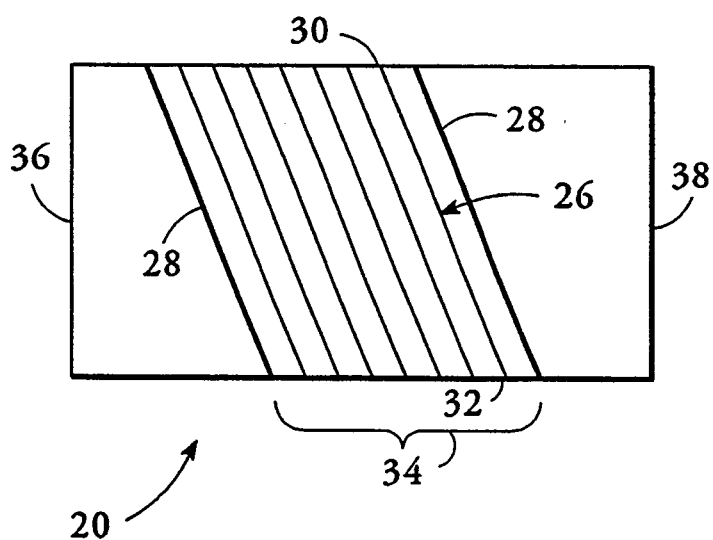
FIG. 2 is a top plan view of the broad area serpentine semiconductor laser of FIG. 1 in accord with the present invention.

With reference to FIG. 2, a top plan view of the semiconductor laser 20 of FIG. 1 is shown. Semiconductor laser 20 has a broad area pumped gain region 34 defined by edges 28 with an angled grating reflector 26 formed therethrough. The pumped region 34 between edges 28 is bounded at one end by a reflective cleaved or etched planar facet 30 and by a similar reflective facet 32 on the other end. The optical resonant cavity of laser 20 is thus defined between first reflective end 30 and second reflective end 32. Side facets 36 and 38 are preferably anti-reflection coated to avoid creation of a side-to-side Fabry-Perot oscillation mode. The regions outside of the gain region 34 may be highly light absorptive in order to further reduce the possibility of parasitic Fabry-Perot oscillation.

Excitation of semiconductor laser 20 is usually accomplished by pumping electrical current through the region 34 by means of stripe shaped conductive surface contacts corresponding to the desired pumped region 34. Although current is here injected through the entire length of the optical cavity, current may also be selectively applied to only a portion of the length of the resonant cavity. Additionally, alternative excitation techniques such as optical pumping may be used.

The light in resonant optical cavity 34 is output from either of reflective ends 30 and 32. However if light is to be output from end 32, then end 30 is preferably highly reflective to avoid loss of light.

Figure 3A:
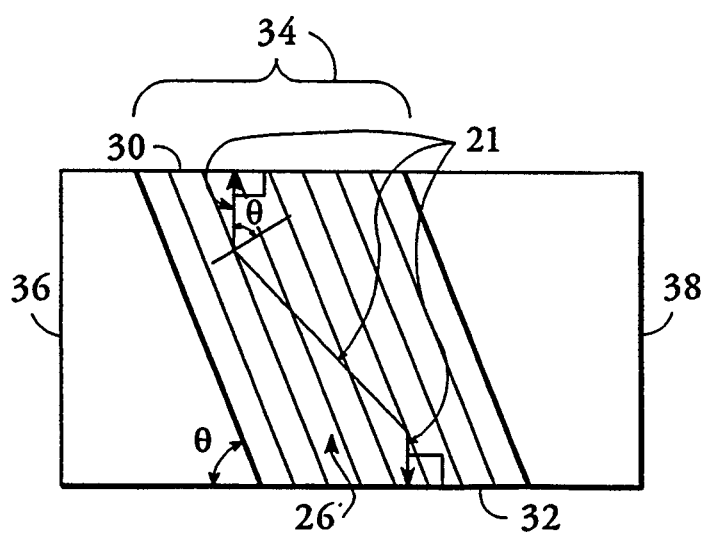
FIG. 3a is a top plan view of the broad area serpentine semiconductor laser of FIG. 1 including the serpentine path of a single lightwave in accord with the present invention.
Figure 4:
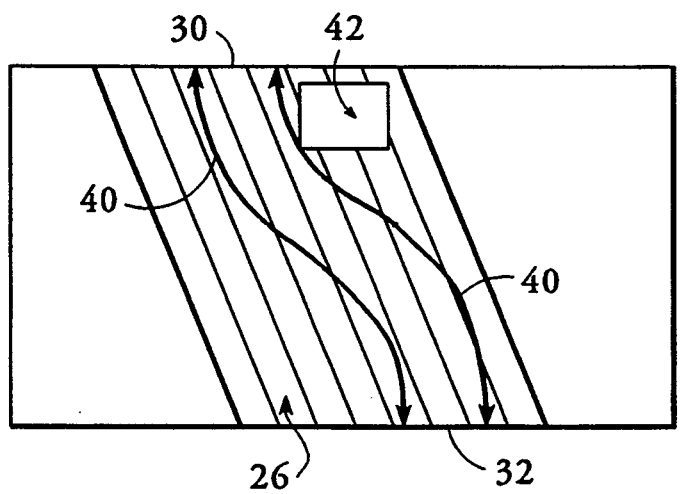
FIG. 4 is a top plan view of the broad area serpentine semiconductor laser of FIG. 1 including the serpentine path of numerous lightwaves in accord with the present invention.

With reference now to FIG. 3a, a top view of one optical path 21 followed by light propagating within the resonant optical cavity is shown. Although numerous similar paths will also be present in the optical cavity, for clarity, only a single light path 21 is depicted in FIG. 3a. The cumulative effect of the superposition of all light paths followed in the laser cavity is an intensity distribution whose envelope delimits a broad region representing the overall path of the beam of lightwaves oscillating within the cavity. An example of a broad beam path is shown in FIG. 4 as the serpentine area between lines 40 between end reflectors 30 and 32.

Figure 3B:
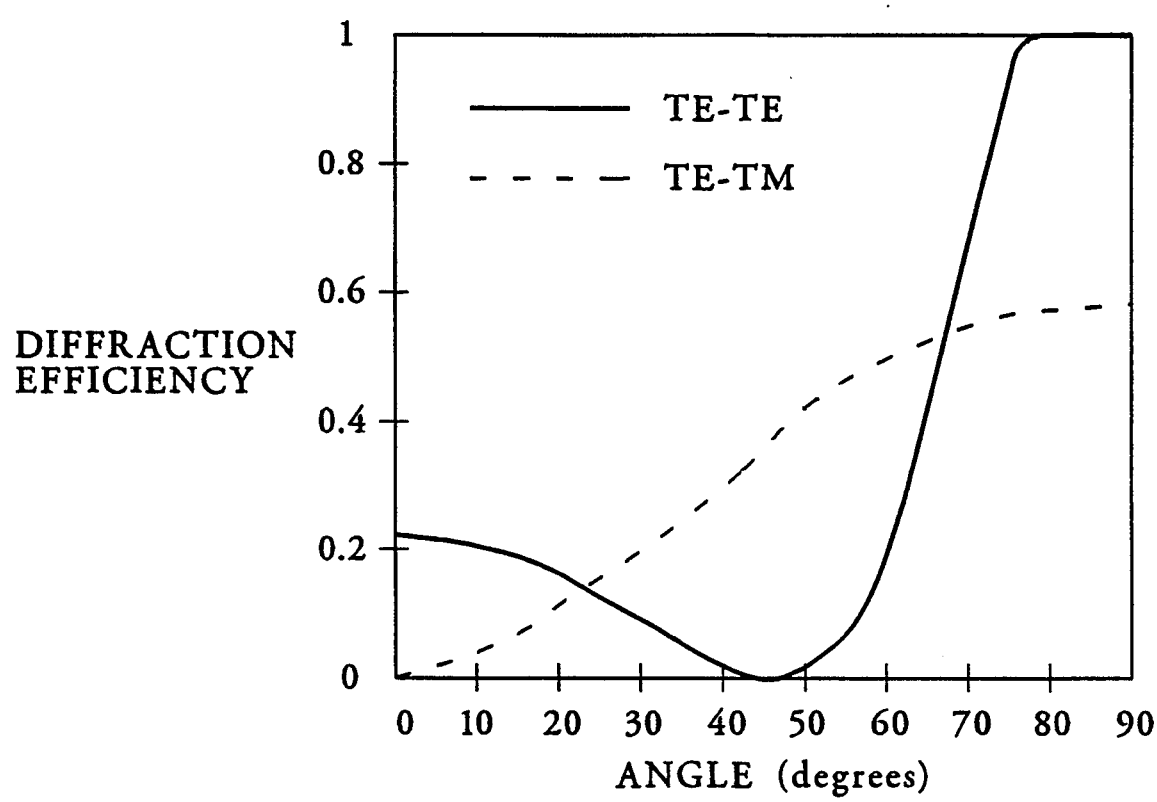
FIG. 3b is a graph of diffraction efficiency of an angled grating in the laser of FIG. 3A versus the angle $\theta$ of light incidence upon the grating.

Referring again to FIG. 3a, angled grating reflector 26 is disposed at a nonperpendicular angle $\theta$ measured perpendicular relative to mutually parallel reflective ends 30 and 32. In the preferred embodiment of the present invention, $\theta$ is greater than 45° and preferably in the range of approximately 70–85 degrees. By forming a reflective angled grating 26 at such an angle $\theta$, light propagating in a direction normal to the end reflectors 30 and 32 will impinge upon angled grating 26 at an incidence angle $\theta$ of approximately 70–85 degrees relative to the normal to the grating. Forming a large incidence angle $\theta$ is beneficial for several reasons. First, as seen in FIG. 3b, angled grating 26 shows increased reflectivity at such shallow incidence, i.e. for large incidence angles $\theta$. Also, the TE-TE reflection mode is enhanced for such incidence angles, relative to the less efficient TE-TM reflection mode. Next, the orientation of the grating for shallow incidence of light directed perpendicular to the end reflectors naturally suppresses unwanted lateral superradiance, due to scattering of the unwanted modes of propagation by the gratings. Further, as the angle of incidence $\theta$ of the light impinging upon angled grating 26 is increased, the required pitch or spacing between reflective portions of angled grating 26 is also increased. As the grating spacing increases, less precision is required in the masking and etching procedures used to form the grating, and the grating becomes easier to fabricate.

As an example, assume an effective refractive index $n_{eff}$ of 3.42, and a selected free space wavelength $\lambda_0$ of 800 nm. Using the aforementioned equation $2\Lambda\cos\theta = m\lambda_0/n_{eff}$, where $\Lambda$ is the tooth spacing or "pitch" of angled grating 26, $\theta$ is the incidence angle that lightwaves make with respect to the normal to the teeth of angled grating 26, and m is an integer representing the diffraction order, in this case m=1 or 2, we find:

|            | m = 1         | m = 2         |
| ---------- | ------------- | ------------- |
| θ = 0°     | Λ = 0.12 μm   | Λ = 0.23 μm   |
| θ = 70°    | Λ = 0.34 μm   | Λ = 0.68 μm   |
| θ = 75°    | Λ = 0.45 μm   | Λ = 0.90 μm   |
| θ = 80°    | Λ = 0.67 μm   | Λ = 1.35 μm   |
| θ = 85°    | Λ = 1.34 μm   | Λ = 2.68 μm   |

As seen in the chart, the grating pitch Λ is increased by a factor between about 4 and 10 by using high angles of incidence θ, as compared to conventional grating-coupled laser diodes which operate at θ=0°. The larger grating pitches Λ can be readily manufactured using highly efficient and economic holographic techniques, whereas the short pitch required for θ=0° gratings may require much more expensive technology, such as electron-beam writing. While first order (m=1) and second order (m=2) gratings are illustrated in the example given above and are generally preferred, it should be noted that higher order gratings (m>2) with even larger grating pitches Λ could also be used.

Directions of light propagation within the cavity are constrained by reflective ends 30 and 32 in combination with the very narrow reflectivity response of angled grating reflector 26. This response can be expressed either as an angular bandwidth of a few hundredths of a degree (approximately 0.1 to 1.0 millirad) for a particular wavelength of incident light or as a spectral bandwidth of a few angsttoms (approximately 0.1 to 1.0 nanometers, depending on the number of grating teeth interacting with the lightwaves) for a particular incidence angle. Because of this very narrow reflectivity response, only lightwaves that propagate at normal or nearly normal incidence to the end reflectors 30 and 32 (so that light is within the reflection band of the grating) or in a second direction at twice the angle of the grating 26 will be diffracted by the grating.

The narrow spectral bandwidth for reflection by grating 26 also means that the particular frequency of light in the resonant optical cavity 34 that results in reflection by grating 26 is likewise determined. Therefore, the lightwaves are made to oscillate in the particular longitudinal mode that results in maximum coupling (and thus minimum loss) between reflective ends 30 and 32. Thus, the semiconductor laser shown in FIGS. 1-4 can operate in a stable, single longitudinal mode (single frequency).

Referring now to FIG. 4, the laser also operates in a coherent, filament-free spatial mode. A pair of degenerate spatial modes having identical intensity are spaced around the longitudinally resonant single wavelength beam of laser light. The degenerate spatial modes have slightly differing angles. Due to the differing angles, the propagation constants of the degenerate modes are also slightly different. As a result, when the two spatial modes combine within resonant optical cavity, a beat frequency or beat length is produced. The beat length L of the two modes is given by $2\pi/\Delta\beta$, where $\Delta\beta$ is the difference in propagation constants of the two spatial modes. However, $2\pi/\Delta\beta$ is roughly equal to $2\pi/k$ where k is the coupling coefficient. Therefore, if k=100 cm$^{-1}$ a beat length L of about 630 microns is produced. By separating the end reflectors 30 and 32 by a distance which is an integral number of the above described beat lengths, the repeated propagation of a single spatial mode is facilitated. Furthermore, since reflective grating 26 is angled with respect to reflective ends 30 and 32, only the spatial mode which impinges upon ends 30 and 32 at normal incidence will be repeatedly reflected, and all other spatial modes will cancel. Thus, a serpentine laser beam having a single spatial and longitudinal mode is generated in the semiconductor laser of the present invention.

Grating reflector 26 distributes light of a selected wavelength along a broad serpentine path 40. The selected wavelength's many parallel light paths 21 are spread across a large portion of the optical cavity so that the entire laser is coherently locked. Both the distributed nature of angled grating 26 and the broad area of the single wavelength's path across resonant optical cavity cause coherent coupling of the light leading to stable light gain without filamentation.

In addition to the use of anti-reflective sides 36 and 38, and light absorptive regions outside of resonant optical cavity 34, a feedback suppression mechanism 42 may be incorporated into a region of resonant optical cavity 34. Feedback suppression mechanism 42 prevents the oscillation of light along a straight path between reflective ends 30 and 32. By having feedback suppression mechanism 42 located as shown in FIG. 4, lightwaves which do not propagate along paths similar to path 21 in FIG. 3a within a serpentine region 40 are absorbed before any linear oscillation of the lightwaves is initiated. Feedback suppression mechanism 42 is formed of region of low transmission, such as an etched facet.

Thus, a broad area serpentine semiconductor laser is disclosed which has an angled reflective grating 26, and which generates a coherent single wavelength and single spatial mode beam in a single waveguide section without producing mutually incoherent light filaments, or requiring complex fabrication methods. Furthermore, the serpentine semiconductor laser of the present invention allows for a larger grating period thereby simplifying the fabrication of reflective grating 26.

Figure 5A:
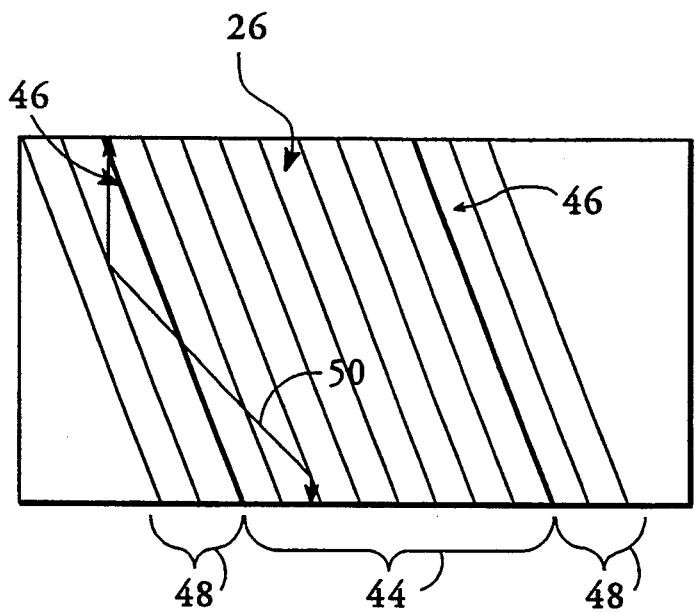

The angled grating 26 covers all of the pumped gain region 34 between edges 28 in the embodiment shown in FIGS. 1-4. Alternate arrangements or configurations of angled grating 26 are also possible. Referring now to FIGS. 5a-d, broad area semiconductor lasers constructed in accord with the present invention are shown having such alternative angled grating configurations. In FIG. 5a, angled grating 26 extends beyond pumped region 44, bordered by edges 46, and into the surrounding unpumped regions 48. In so doing, angled grating 26 is able to re-direct light which escapes from pumped region 44, such as is shown by beam 50, back into the lasing pumped region 44 of angled grating 26. Additionally, by enlarging the area through which the selected light travels to include regions 48 outside of pumped region 44, coherent coupling of the light is increased. Thus, increased gain with a heightened modal selectivity is achieved with the configuration shown in FIG. 5a.

Figure 5B:
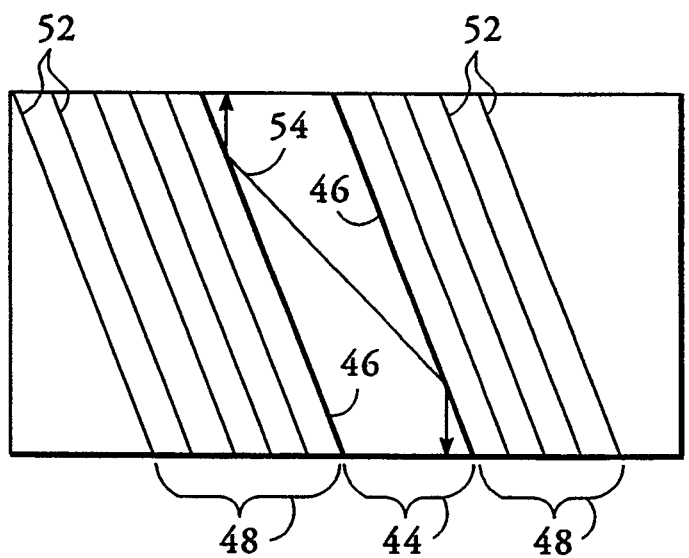

With reference to FIG. 5b, a pair of angled gratings 52 are located only in regions 48 outside of the pumped central region 44. Lightwaves of the selected wavelength, represented by light path 54, are reflected by angled gratings 52 residing outside of pumped region 44. By arranging angled gratings 52 only outside of pumped region 44, distributed light losses associated with having the grating arranged within pumped region 44 are reduced. As a result, a lower threshold current density and a higher slope efficiency are obtained.

Figure 5C:
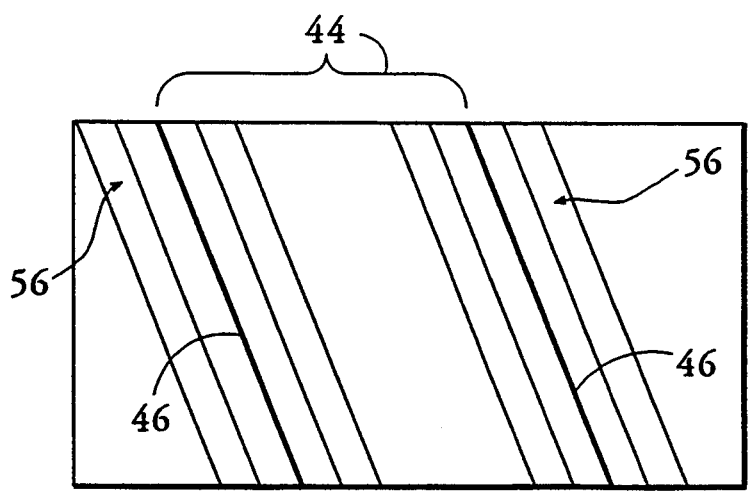

Referring now to FIG. 5c, a top view of a "hybrid" combination of the grating configurations of FIGS. 5a and 5b is shown in which gratings 56 are disposed partially within the pumped region 44 and with a portion of gratings 56 extending outside of pumped region 44. The configuration of FIG. 5c provides both the high modal selectivity associated with the configuration of FIG. 5a, as well as the reduced loss, lower threshold current density, and a higher slope efficiency benefits of configuration FIG. 5b.

Referring now to FIG. 5d, an angled grating 77 is fabricated opposite to a reflecting surface 79. The reflecting surface is oriented parallel to the grating teeth such that light rays 80 reflected by the grating 77 and incident upon the reflecting surface 79 strike the parallel end reflectors 81 and 82 at normal incidence. To form the reflecting surface 79, any of several known techniques, including ion beam etching, ion milling, chemical etching, impurity induced disordering, cleaving and substrate pregrooving, could be used.

With reference to FIG. 6, the angled grating 23 between end reflectors 30 and 32 can have a quarter wave shift incorporated into it. The angled grating 23 has a first set of parallel, periodically spaced, partial reflectors 25 and a second set of parallel, periodically spaced, partial reflectors 27, each with a grating pitch $\Lambda$. The two sets of reflectors 25 and 27 are adjacent to one another, separated only by an area 29 with a reflector-to-reflector spacing of $\Lambda (n+\frac{1}{2}m)$, where n is an integer 0,1,2,etc., and where m is the diffraction order of the angled grating 23. The grating 23 as a whole has a reflection response which essentially is that of a like grating without the incorporated phase shift, except that the intensity envelope of the coherently diffracted beam is a tilted linear stripe coinciding with the pumped gain region 34 instead of a serpentine shaped area. Instead of a single control quarter-wave phase shift, two eighth-wave phase shifts located at one-third and two-thirds of the distance laterally across the pumped gain region could be incorporated into the grating. Other distributed phase shifts totaling one-quarter wavelength across the gain region 34 could also be incorporated.

Figure 7B:
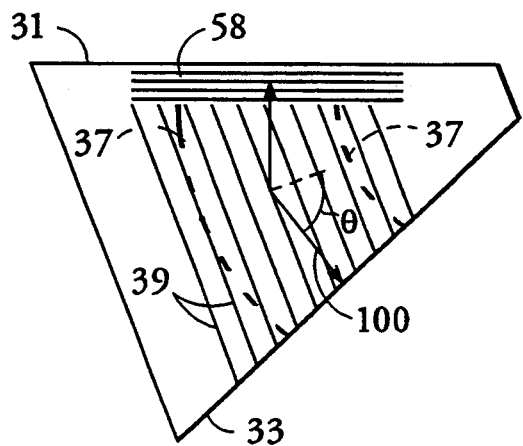

With reference now to FIGS. 7a and 7b, the end reflectors 31 and 33 of a laser with angled grating 39 need not be parallel to one another, but can instead be oriented at an angle to one another. Preferably, the grating 39 is oriented at the same angle $\theta$ relative to both end reflectors 31 and 33. A conductive contact stripe, delimited in FIGS. 7a and 7b by dashed lines 37, defines a curved pumped gain region 35 coinciding generally with the intensity distribution envelope of the coherently diffracted light beam within the cavity. One of the end reflectors 33 may be a cleaved facet, while the other may be an etched facet mirror 31 or a DBR grating 58. The propagation of individual light rays 100 is shown in FIG. 7b. Preferably, the light rays 100 are incident upon the angled grating 39 at a shallow incidence angle ($\theta > 45°$).

Figure 7C:
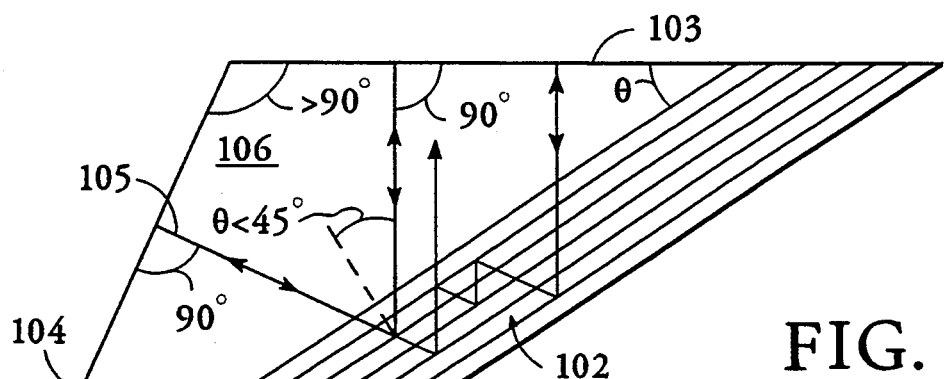

FIG. 7c shows another laser with a grating 102 oriented at an angle $\theta$ to the end reflectors 103 and 104, in which the end reflectors 103 and 104 are not parallel to one another. Light rays 105 propagating in the pumped gain region 106 are incident upon the end reflectors 103 and 104 at a perpendicular angle. The grating 102 may extend over a broad area of the gain region 106, to provide the grating with sufficient opportunity to distribute the light over a broad area.

Figure 7D:
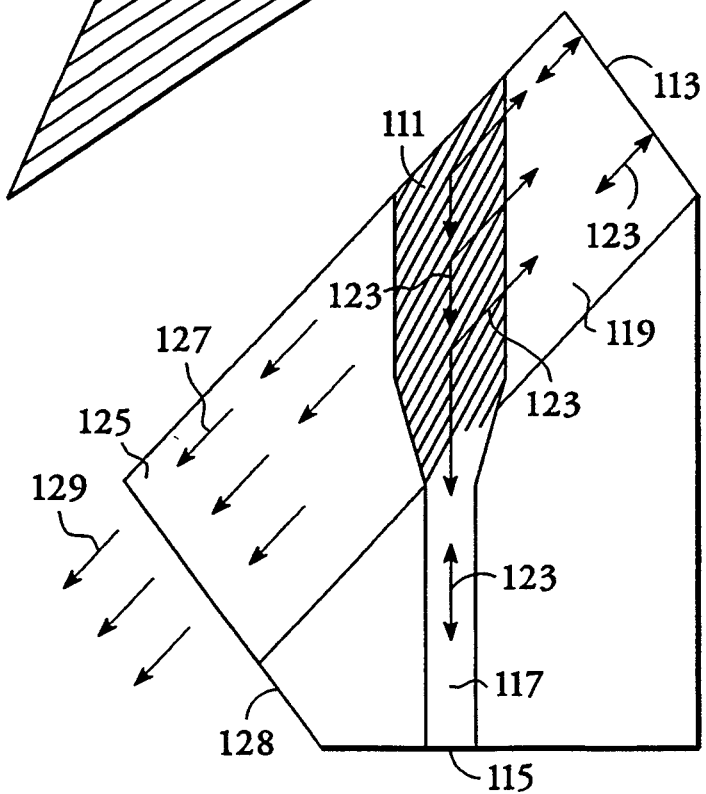

With reference to FIG. 7d, another laser structure includes a periodic grating reflector 111 upon which the light 123 is incident at an angle other than the normal to the grating 111. Thus, the light 123 is laterally coupled between a pair of noncollinear cavity sections 117 and 119 via distributed reflection by the angled grating 111. The noncollinear first and second laser cavity sections 117 and 119 may be a broad area gain region 117 and a single transverse mode waveguide 119. The periodic grating reflector 111 is disposed at a common end of the two cavity sections 117 and 119 for coupling light 123 from one section to the other. Reflectors 113 and 115, such as mirror facets, DBR gratings or corner reflectors, are disposed at ends of the cavity sections 117 and 119 opposite from the periodic grating reflector 111, and together with the grating reflector 111 define a folded optical cavity within which lightwaves 123 propagate under lasing conditions. As in the previous embodiments, the light propagation direction in each section 117 and 119 of the folded cavity is perpendicular to the corresponding planar reflector 113 or 115 at the end of that section 117 or 119. Preferably, the grating 111 is oriented such that a shallow angle of incidence ($\theta > 45°$) of light rays 123 is obtained. Accordingly, the light 123 is efficiently reflected from cavity section 117 or 119 to the other at more than a right angle. One advantage of this orientation of the periodic grating reflector 111 is that high TE-to-TM mode conversion can be avoided. As seen previously in FIG. 3b, the relative strength of such conversion peaks at 45° incidence and falls off for larger incidence angles. The overall diffraction efficiency increases for incidence angles greater than 45° as TE-to-TE reflectivity increases. The nonperpendicular angle of the length of the broad area portion 119 with respect to the waveguide portion 117 also somewhat increases the path length experienced by lightwaves 123 in the grating 111 to further improve reflection into the waveguide 117. The grating 111 is preferably made wider than the waveguide 117 by providing a tapered transition in which the grating reflector 111 gradually expands in width outward from the waveguide 117, like the bell end of the horn, to improve reflection of light 123 in the broad area waveguide 119 into the narrow waveguide 117. The light 127 that passes through the periodic grating reflector 111 from the broad area portion 119 into an amplifier section 125 can be used to form an output beam 129. Alternatively, the light output can be extracted through either of facets 113 and 115. Either or both of the reflective facets 113 and 115 may be coated for near 100% reflection. Again, output facet 128 is preferably AR coated to avoid unwanted reflections that would cause a collinear light path to lase in preference to the folded light path.

Figure 7E:
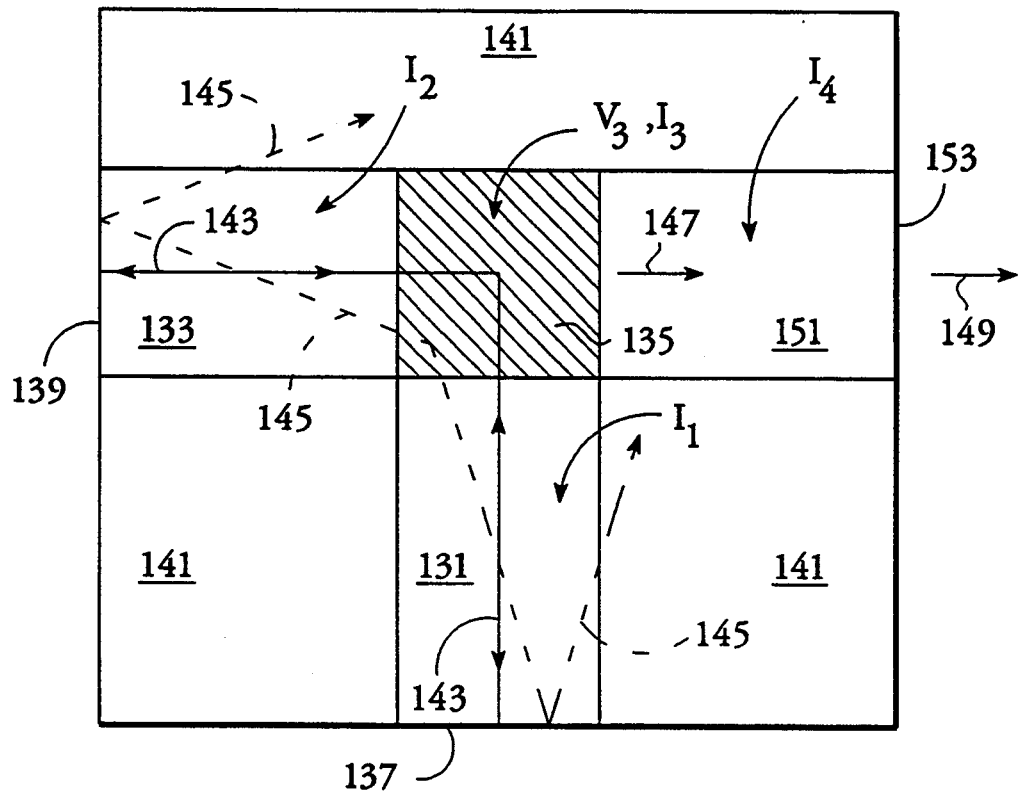

With reference to FIG. 7e, a laser structure with a folded cavity may have a pair of broad area cavity sections 131 and 133 coupled to one another by means of a periodic grating reflector 135. At one end of each of the broad area cavity sections 131 and 133, opposite from the end at which the grating reflector 135 is situated, are reflectors 137 and 139, such as cleaved or ion milled facets or DBR gratings. The periodic grating reflector 135 is oriented in FIG. 7e at a 45° angle with respect to reflectors 137 and 139. Broad area cavity sections 131 and 133 and grating reflector 135 may be separately pumped. Unpumped absorbing sections 141 may bound the cavity sections 131 and 133 to avoid unwanted reflections. The laser structure in FIG. 7e is similar to that seen in FIG. 7d, except that region 131 is a broad area cavity section, instead of a single transverse mode waveguide, and the grating orientation is at 45° relative to the end reflectors 137 and 139.

The reflectors 137 and 139 determine and fix the angle of incidence of light onto the periodic grating reflector 135 for lasing action. In order for light to make a round trip in the folded cavity, the light must strike and be reflected by the reflectors 137 and 139 at normal incidence, as represented in FIG. 7e by the solid line light path 143. Any light propagating in the folded cavity that strikes the reflectors 137 and 139 at non-normal incidence, as represented in FIG. 7e by the dashed line path 145, will eventually bounce out of the broad area gain regions 131 and 133, and even if it does remain in the broad area gain regions 131 and 133, will be incident upon the periodic grating reflector 135 at a different angle from that which it first encountered the grating reflector 135, and thus will not be reflected. With the light propagation directions in the folded cavity selected by the orientation of the reflectors 137 and 139, and thus the light incidence angle relative to the grating reflector 135 fixed, the lasing wavelength is uniquely determined by the narrow frequency band of the grating's reflectivity response. Only one longitudinal mode or frequency oscillates. The grating reflector 135 spreads the lightwaves across the entire width of broad area regions 131 and 133, preventing development of stable light filaments. The grating 135 is typically shaped as a square to create substantially equal reflection across the broad area regions 131 and 133. However, the shape of the grating 135 could also be tailored to provide a Gaussian or other intensity distribution across the broad area regions 131 and 133, and thereby provide a Gaussian output beam. Light 147 that is transmitted from one broad area portion 133 through the periodic grating reflector 135 may be used to form the output beam 149. An amplifying section 151 pumped by current $I_4$ may be used to further enhance the output beam emitted through facet 153. This facet 153 is preferably AR coated such that reflections between reflectors 139 and 153 do not cause collinear oscillation thereby overriding the folded cavity. One or both of the reflectors 137 and 139, if mirror facets, may be coated to produce near 100% reflectivity. Alternatively, the output beam may be extracted from either broad area portion 131 or 133 through the corresponding reflector 87 or 89. If output is desired from facet 139, for example, facet may be nearly 100% reflecting, while region 151 may be left unpumped, or even reverse biased, so as to be rendered more absorbing.

Figure 7F:
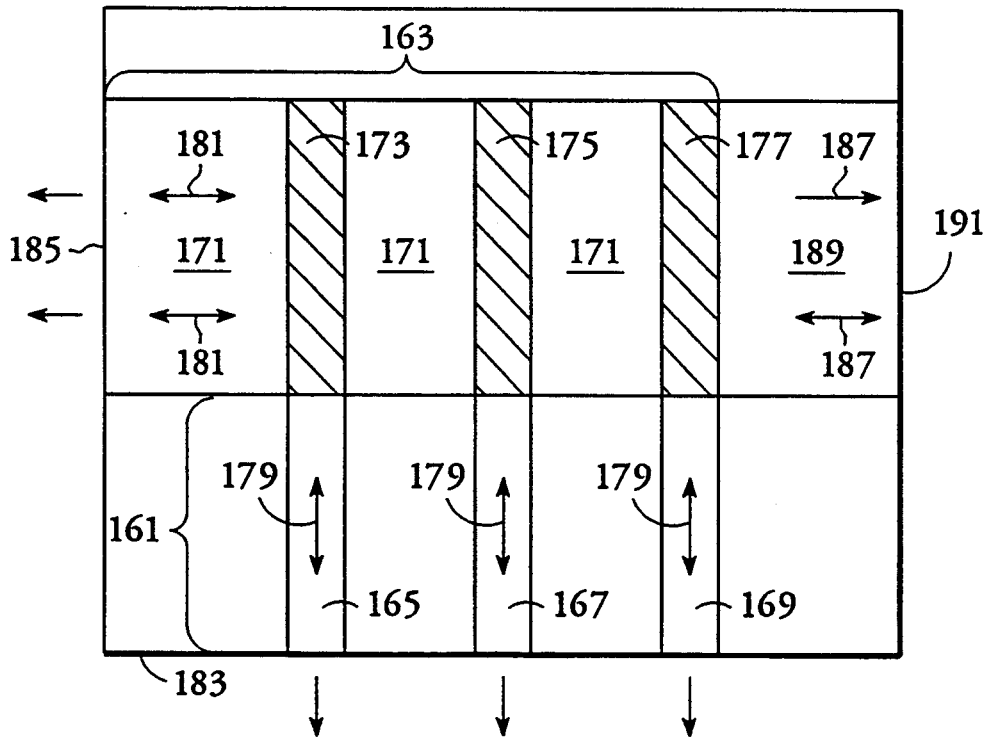

With reference to FIG. 7f, a folded cavity laser array structure includes noncollinear first and second laser sections 161 and 163. The first laser section 161 has a plurality of single transverse mode waveguides 165, 167, 169, etc. The second laser section 163 has a single broad area gain region 171 divided into a like plurality of successive waveguide segments. A plurality of periodic grating reflectors 173, 175, 177, etc. optically couple the respective waveguides 165, 167, 169, etc. of the first laser section 161 to the broad area gain region 171 of the second laser section 163. Each of the periodic grating reflectors 173, 175, 177, etc. is positioned at an end of a corresponding waveguide 165, 167, 169, etc. and across the entire width of the broad area gain region 171, dividing the broad area gain region 171 into successive segments. Each periodic grating reflector 173, 175, 177, etc. is oriented with its grating teeth at a 45° angle to the length of the corresponding waveguide 165, 167, 169, etc. and also at a 45° angle to the length of the broad area gain region 171. Lightwaves 179 propagating in the single transverse mode waveguides 165, 167, 169, etc. are reflected at right angles by the periodic grating reflectors 173, 175, 177, etc. into the broad area gain region 171 to provide lightwaves 181 spread in a coherent phase-locked manner across the entire width of the broad area gain region 171. Likewise, lightwaves 181 are partially reflected by each grating 173, 175, 177, etc. from the broad area gain region 171 into the plurality of waveguides 165, 167, 169, etc. in the array. Cleaved or ion milled planar facet reflectors 182 and 185 at ends of the narrow waveguides 165, 167, 169, etc. and broad area gain region 171 combine with the periodic grating reflectors 173, 175, 177, etc. to form the resonant optical cavity for the laser array structure. The propagation direction of light 179 in waveguides 165, 167, 169, etc. and the propagation of light 181 in broad area gain region 171 are perpendicular to the mirror facets 183 and 185, respectively, because any other direction would not result in a sustainable retracing path of oscillation. The laser embodiment in FIG. 7f prevents light filaments from building up in the broad area section 163 of the resonant cavity by using the periodic grating reflectors 173, 175, 177, etc. to spread the light 179 reflected from the corresponding array of waveguides 165, 167, 169, etc. across the entire width of the single broad area gain region 171 in a coherent manner.

All of the gratings 173, 175, 177, etc. may be tuned to reflect light at the same wavelength. In this case, some of the light 181 in the broad area gain region 171 is partially reflected by the first grating 173 into the waveguide 165 and partially transmitted to the second grating 175, where the light is again partially reflected into the waveguide 167 and partially transmitted to the next grating 177, etc. In this way, the entire array 161 of waveguides 165, 167, 169, etc. is phase-locked. Alternatively, each of the gratings 173, 175, 177, etc. may be tuned to reflect a different wavelength of light. In this case, each of the narrow waveguides 165, 167, 169, etc. and corresponding grating reflectors 173, 175, 177, etc., together with the common broad area gain region 171 and facet reflectors 183 and 185, forms a separate laser resonant cavity tuned to oscillate at a different wavelength of light. The light can be coupled out of the laser oscillator either from the array of waveguides 165, 167, 169, etc. through the facet 183, or from the broad area gain region 171 through the facet 185. Alternatively, the light 187 transmitted through the last grating 177 in the series at one end of the broad area gain region 171 into the amplifier 189 may be used to form an output beam through facet 191. Either or both facet reflectors 183 and 185 can be coated for high reflectivity or low reflectivity, as appropriate.

Figure 8:
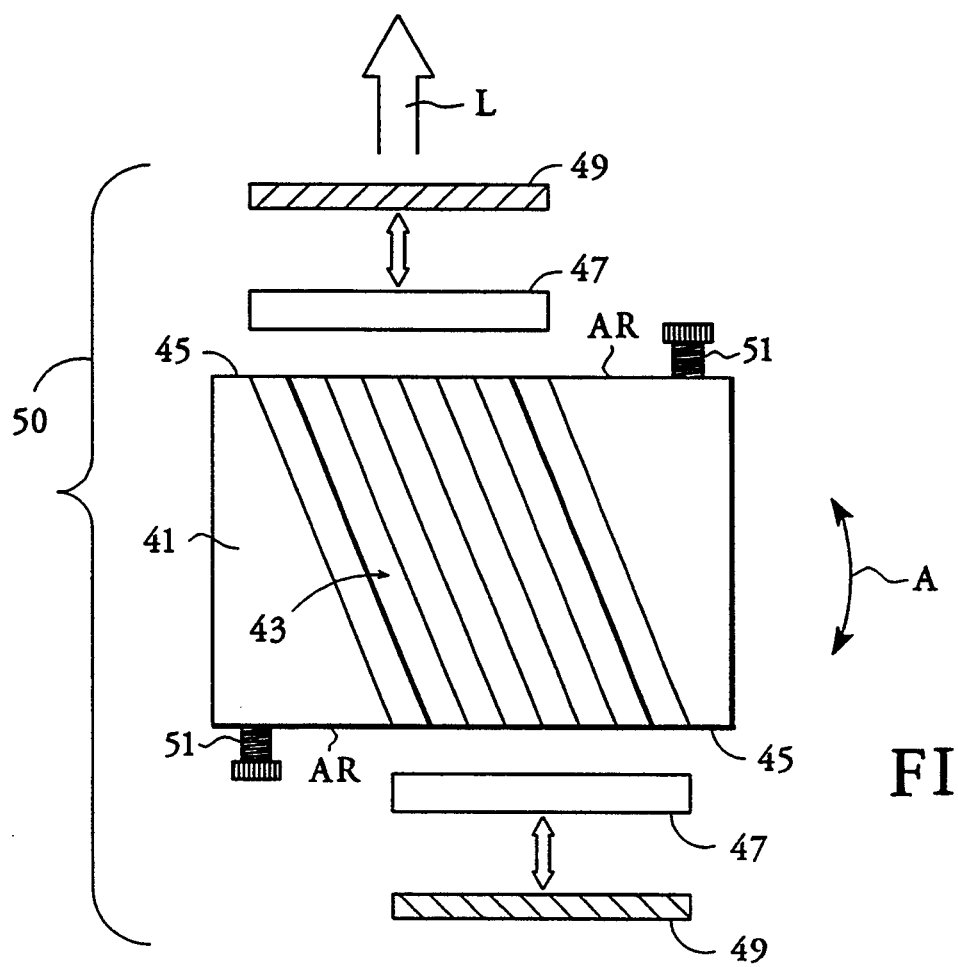

With reference in FIG. 8, a tunable laser 50 may be formed with a semiconductor amplifier body 41 having a grating 43 angled relative to anti-reflection coated end facets 45, cylinder lens 47 and external cavity mirrors 49. The orientation of the angled grating 43 relative to the external cavity mirrors 49 can be adjusted by rotating the semiconductor amplifier body 41 about an axis perpendicular to the active light generating region of that body by an angle A. Such rotation can be done mechanically with adjustable screws 51 or electromechanically with piezoelectric crystals attached to or abutting the semiconductor amplifier body 41. Laser light output L is principally through one mirror 49.

Figure 9A:
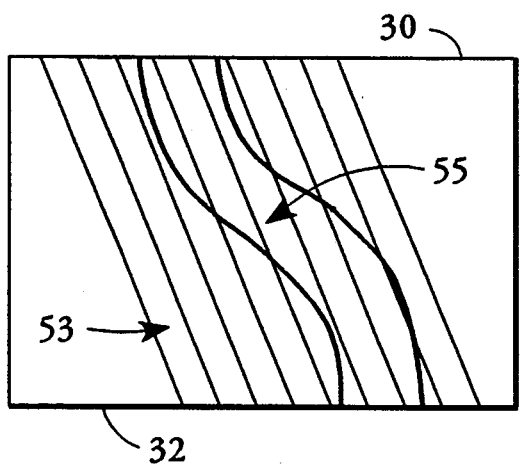

With reference to FIG. 9a, the pumped gain region 55 of the laser preferably coincides with the intensity distribution of the coherently diffracted light beam in the cavity that is established by the angled grating 53 and end reflectors 30 and 32. In lasers having a serpentine intensity distribution, as in FIG. 9a, the pumped gain region 55 thus will be designed to have the same serpentine shape. The shape of the gain region 55 can be defined by well-known current confining structures within the laser body or by a serpentine shaped conductive contact stripe. Selective optical pumping could be achieved with an opaque light blocking layer shaped to admit light to the active region in the desired pump pattern or by optical imaging of the pump light onto selected regions of the light generating material body.

Figure 9B:
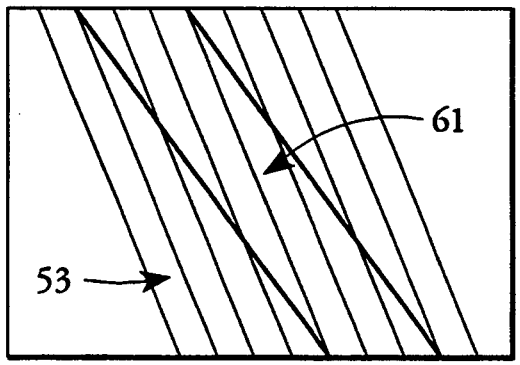

Referring to FIGS. 9b–9d, the possible shapes for the pumped gain region include tilted linear stripes like that in FIG. 2. In FIG. 9b, the gain stripe 61 is oriented at a steeper tilt angle than the angled grating 53, while in FIG. 9c, the gain stripe 63 is oriented at a shallower tilt angle, i.e. a more nearly perpendicular angle, than the angled grating. As seen in FIG. 9c, the gain region 65 can be flared with a narrower end expanding in width to a wider opposite end. This flare in width can be applied to any of the tilted or serpentine pump stripe shapes.

With reference to FIGS. 9e and 9f, different areas of the pumped gain region may be independently supplied with pump current, or even reverse biased, so that a non-uniform pump distribution is possible in some circumstances. For example, in FIG. 9e, multiple contacts 67a and 67b independently supply the angled grating 53 region with current. Since the current injected into the grating region affects the effective refractive index, and thus the effective grating pitch, the current density across the entire pumped area of the grating region should be uniform if oscillation is to be achieved. Varying the current supplied by one contact 67a relative to that supplied by the other 67b changes the Q of the cavity, so that deliberate modulation of current to one contact 67a will modulate the light output from the laser. In FIG. 9f, the grating region 71 has a pumped gain region 69, while a DBR grating end reflector 75 is pumped by another contact 73. Varying the current supplied by contact 73 to DBR reflector 75 allows for frequency tuning of the laser. Alternatively, the effective refractive index may be varied under the angled grating in FIGS. 9a–d by a variation in current to allow wavelength tuning.

With reference to FIG. 10, a laser with angled grating 70 and end reflectors 72 and 74 is characterized by the grating 70 not extending over the entire length of the resonant cavity defined between end reflectors 72 and 74 but rather over only a portion of the length of the cavity. A broad area gain region 78 is optically coupled at one end of the grating 70 to the pumped gain region 76 associated with the grating 70. The broad area gain region 78 provides a region of high gain for high output powers, while the angled grating 70 coherently diffracts light laterally within the cavity to eliminate optical filamentation and to stabilize the transverse and longitudinal modes of oscillation of the beam within the cavity. Gain regions 76 and 78 may be supplied independently with pump current.

Figure 11:
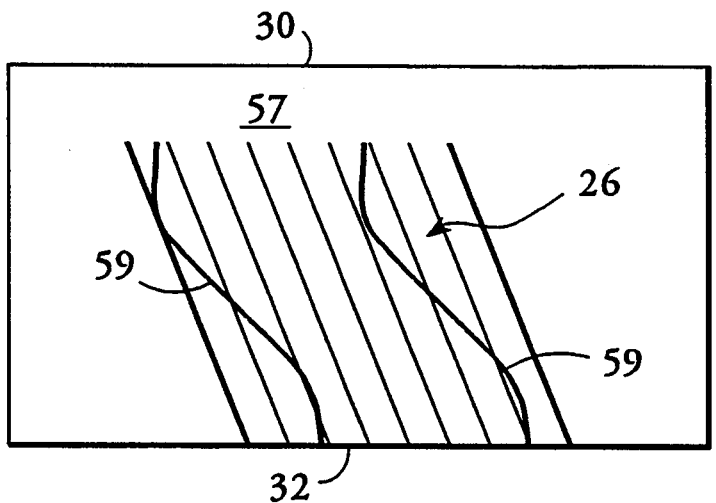
FIG. 11 is a top plan view of a broad area serpentine semiconductor laser containing a spatial mode filter in accord with the present invention.

With reference now to FIG. 11, the broad area serpentine laser may include a transparent window region 57 adjacent to at least one, and possibly both, of the end reflectors 30 and 32. Preferably, the angled grating reflector 26 extends over at least 90% of the length of the resonant cavity defined between the two end reflectors 30 and 32. The pumped portion 59 which may correspond to the mode shape of the beam in the cavity, is typically confined to regions other than the window region or regions, which are normally unpumped.

Figure 12:
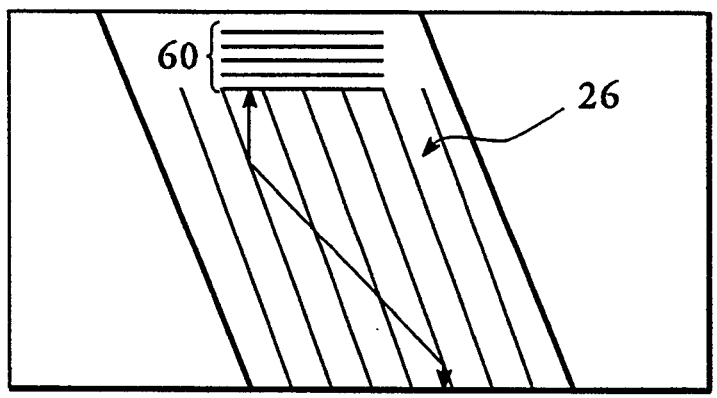
FIG. 12 is a top plan view of a broad area serpentine semiconductor laser having a distributed Bragg reflector grating as one of the reflective ends in accord with the present invention.

With reference to FIG. 12, a top view of an alternate embodiment of the present invention is shown in which a distributed Bragg reflector (DBR) grating 60 is employed as one of the reflective ends of the broad area semiconductor laser. DBR grating 60 is used instead of cleaved or ion milled mirror facets such as facets 30 and 32 of FIG. 1. Dielectric stack reflectors could also be used.

With reference now to FIGS. 13a and 13b, a monolithically coupled array 62 is formed of a plurality of broad area semiconductor lasers 64, 66, 68, etc. Each of the lasers of the coupled array 62 is formed with a grating reflector oriented for angled diffraction. Strong coupling within the array 62 is obtained by laser light transmission between adjacent lasers. The strong coupling eliminates the need for additional phase adjustments between the output beams 70 of lasers 64, 66, and 68, etc., and increases the efficiency of the laser array 62. Thus, a laser array 62 of increased efficiency, which produces a coherent phase-locked output beam with a reduced divergence is disclosed. If the angled gratings are oriented for a large (shallow) angle of incidence of light directed perpendicular to the end facets, one gets natural ASE suppression due to scattering of unwanted modes of propagation by the gratings. A lens system may be used to focus the plurality of output beams into a small spot such as the end of an optical fiber.

As seen in FIG. 13b, partial or total light blocking regions 86 which at most allow only a portion of the diffracted light to pass into adjacent regions can be used, if desired, in a laser array 83 with angled gratings to achieve coherent laser light coupling while further suppressing unwanted lateral oscillation. Such light blocking regions or strips 86 can be formed by pregrooving the laser substrate, by etching through the active region after growth, or by many other known methods. Coupling is achieved via light transmission between the individual emitters of the array 83 only in those regions where blocking strips 86 are absent between adjacent emitters 64, 66, 68, etc. Output beam 70 emerges from the serpentine laser regions.

Figure 14A:
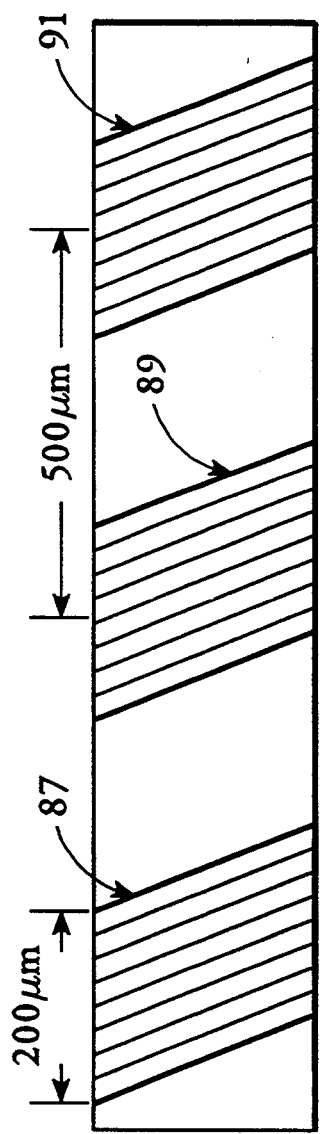

With reference now to FIG. 14a, a top view of an alternate embodiment of the laser array of the present invention is shown having a plurality of serpentine lasers with 200 micron wide stripe-shaped pumped regions 87, 89, 91, etc. The centers of adjacent pumped regions 87, 89, 91, etc. are separated by a distance of 500 microns. The array is generally mounted on a thermally conductive substrate, not shown, in order to dissipate heat which may be generated during operation of the laser. Water may be pumped through the substrate to provide further cooling. Additionally, dry nitrogen gas can be flowed over the array to prevent condensation at the device level.

The large, 500 micron, interelemental spacing between the lasers does not promote strong coupling between the adjacent lasers. Additionally, temperature gradients which occur within the array slightly alter the grating period of the individual lasers. As a result, the individual elements within the array of the present embodiment do not coherently phase-lock. Although coherence between the output beams is minimal, each element of the array produces a nearly diffraction-limited beam. Output power in excess of 12W continuous-wave and 20W pulsed has been measured for drive currents of up to 30A, with a lateral far field of approximately 0.3 degrees. Alternatively, the interelemental spacing between the lasers 87, 89, 91, etc. can be reduced to provide coupling between adjacent lasers in the array. The coupling regions between the laser elements may be provided with separate conductive contacts for independent biasing of such interelemental regions. Such biasing can be used to adjust the phases of light crossing the coupling regions from one laser element to another in order to control the phases of the lasers in the array. In FIG. 14a, separate grating areas may be fabricated with different periods or with separate electrical contacts for adjusting the equivalent refractive index to allow laser element to operate at a separate wavelength. The array can also be constructed with a continuous chirp in which the grating period varies continuously across the array.

Figure 14B:
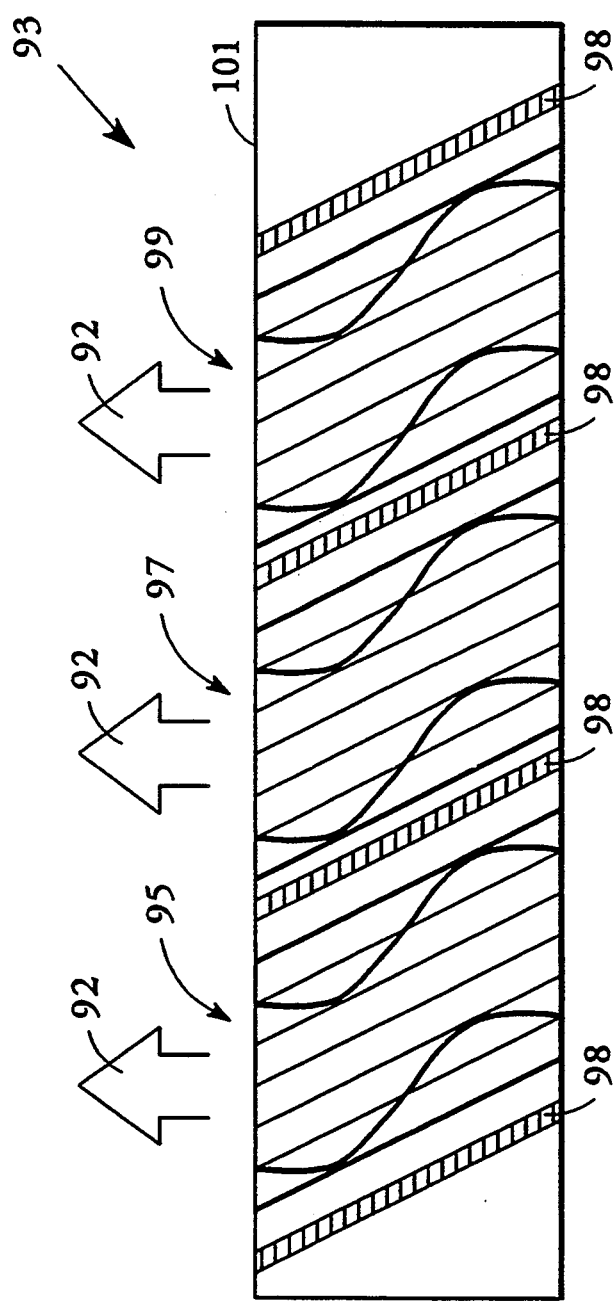

Referring to FIG. 14b, separate angled grating structures 95, 97, 99, etc. are separated from each other by partial or total light blocking regions 98. These regions 98 suppress superradiance along the length of the array 93 so that virtually 100% of the array 93 can emit light normal to a facet 101. The blocking regions 98 can be formed, as in FIG. 13b, by substrate grooves, etching through the laser gain medium or other known techniques. The resulting lasers 95, 97, 99, etc. are not phase coupled to one another and thus operate independently.

Figure 15:
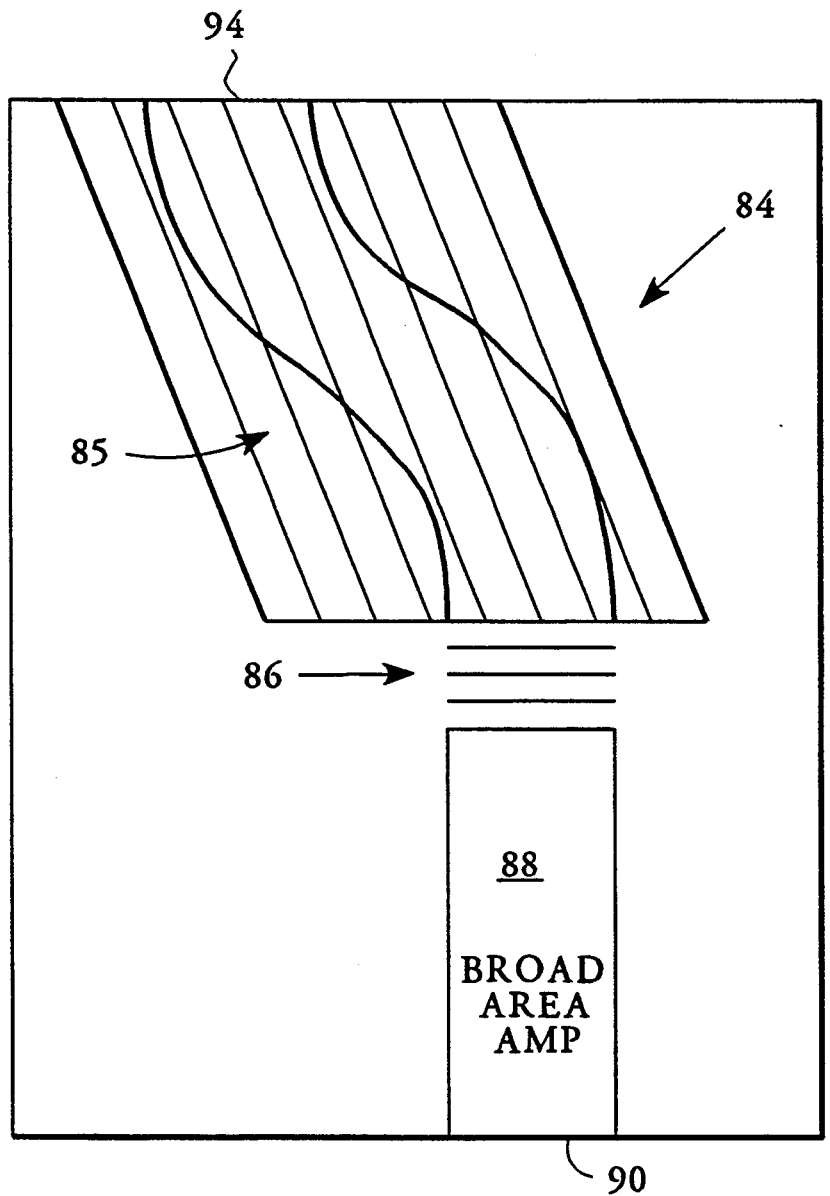

Referring now to FIG. 15, any of the laser structures of the present invention can be used as a master oscillator in a master oscillator power amplifier (MOPA) configuration. In such a configuration, one of the end reflectors of a laser oscillator 84 may be a DBR grating 86 oriented normal to a broad area amplifier 88. DBR grating 86 provides feedback to laser oscillator 84 with angled grating 85 and provides partial transmission of the light into the broad area amplifier 88.

The selected wavelength and single mode qualities of the light generated within laser 84 make the light ideal for distortion-free amplification required in high power applications. Broad area amplifier 88 is independently pumped with a drive current. In the present embodiment, the output from the MOPA is taken from an anti-reflection coated facet 90 positioned at the end of the broad area amplifier 88 opposite from high reflection coated facet 94 of serpentine semiconductor laser 84, however, an additional grating detuned from the second order resonance with the lasing wavelength may also be used as an output port producing a surface-emitted beam.

Window regions could replace the aforementioned optical amplifiers, if desired. Such a window region between the laser 84 and output facet 90 may be unpumped, if the distance in the unpumped region is small enough to avoid significant attenuation due to light absorption. Otherwise, it is electrically pumped, at least to the point where attenuation is zero. This region could also be made with higher bandgap material, or doped with aluminum or silicon to increase its bandgap or disorder the active region, thereby creating a transparent window region between the lasing cavity and the surface emitting grating.

Figure 16:
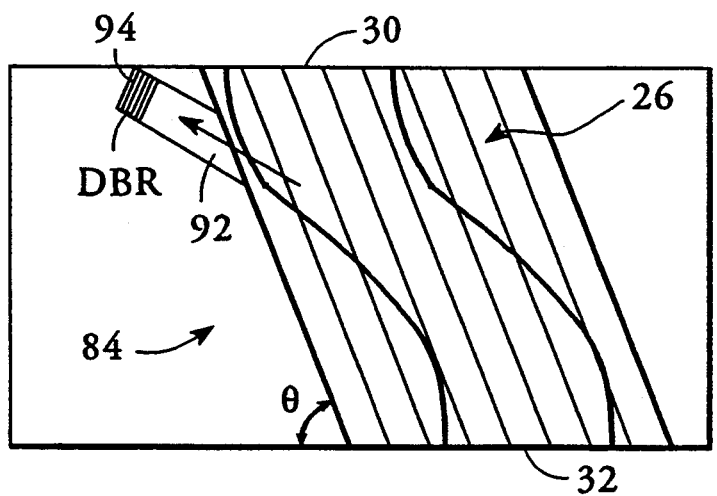
FIGS. 15–17 are top plan views of MOPAs employing the broad area serpentine semiconductor laser of FIG. 1 in accord with the present invention.

With reference now to FIG. 16, a MOPA in which a broad area amplifier 92 is arranged to receive a portion of the light that is laterally diffracted by the angled grating 26 is shown. The exact position and propagation direction of the output beam from the angled grating 26 to the broad area amplifier is determined by the angle e at which angled grating 26 makes with end reflectors 30 and 32, and by the beat length of the serpentine lasing mode. That is, the optimum output beam is taken at position where the Poynting vector is at the Bragg incidence angle to the angled grating 26.

Several advantages are realized by arranging the broad area amplifier 92 as shown in FIG. 16. Since it is not necessary to transmit light through either of reflective ends 30 and 32, both of the ends are made highly reflective. In so doing, the light is more readily reflected back along the serpentine path between reflective ends 30 and 32, thereby providing greater gain of the light. Also, since the amplified beam is not normal to a cleaved facet, the MOPA is less sensitive to amplified spontaneous emission noise due to self-oscillation of the beam within the broad area amplifier.

In FIG. 16, surface emission of the amplified light is obtained through a detuned DBR grating 94. Well-known techniques of producing surface emission includes a second order tuned DBR grating, a detuned DBR output coupler and a 45° etched v-groove reflector oriented to reflect light out of the plane of the action region. Any of these variations can be used to couple light out of any of the lasers of the present invention. Output from the amplifier can also be obtained through alternate techniques.

Figure 17:
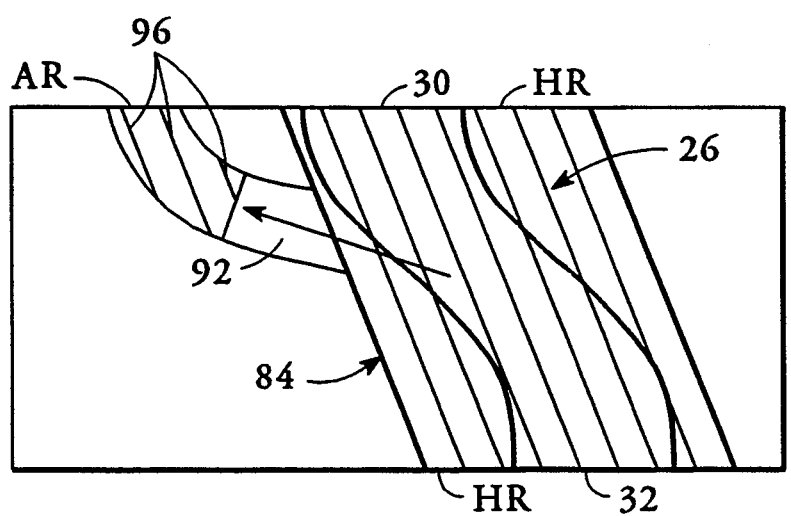

Referring now to FIG. 17, light can be output from broad area amplifier 92 using an angled grating 96 similar to angled grating 26 in serpentine semiconductor laser 84. Angled grating 96 of the amplifier is used to redirect the amplified light normal to a cleaved facet such as end 30. To promote the emission of the amplified light, the portion of reflective end 30 bordering grating 96 should be anti-reflection coated. The MOPAs of FIGS. 15–17, respectively, are advantageous in that they are largely insensitive to unwanted external reflections. That is, the only way in which light can couple back into the laser 84 is by exactly retracing the path of the output beam from the end of broad area amplifier 92 back into the laser 84.

Thus, the present invention provides a broad area semiconductor laser which is able to generate a coherent single wavelength and single spatial mode beam without producing mutually incoherent light filaments, or requiring complex fabrication methods. The present invention further provides a broad area serpentine semiconductor laser which can be used in an array or in a master oscillator power amplifier (MOPA) to produce a coherent output beam for use in high power applications.

We claim:

1. A coherent light generating structure comprising,
at least one active region for generating lightwaves,
excitation means for pumping at least a portion of said at least one active region,
first and second reflective means spaced apart from one another for defining a resonant cavity therebetween, said pumped portion of said at least one active region disposed at least partially within said resonant cavity, and
one and only one broad-area grating reflector disposed within at least a portion of said resonant cavity and oriented at an angle relative to said first and second reflective means for laterally diffracting at least a portion of a beam of said generated lightwaves, said orientation of said grating reflector such that least a specified wavelength of lightwaves generated by said active region and incident on said grating reflector from a direction perpendicular to said first and second reflective means is within a resonance bandwidth of said grating reflector for said lightwaves, said broad-area grating reflector providing lateral confinement of said lightwaves freely propagating within said resonant cavity.

2. The structure of claim 1 wherein a center of said beam of lightwaves at said first reflective means is laterally offset from a center of said beam of lightwaves at said second reflective means.

3. The structure of claim 1 wherein said portion of said active region pumped by said excitation means substantially matches a mode shape for said beam of lightwaves within said resonant cavity.

4. The structure of claim 1 wherein said first and second reflective means are parallel to each other.

5. The structure of claim 1 wherein said first and second reflective means are oriented at an angle relative to one another.

6. The structure of claim 1 wherein said grating reflector is oriented at an angle of at least 45° relative to said first and second reflective means, such that lightwaves propagating in a direction normal to said first and second reflective means are incident on said grating reflector at a shallow incidence angle.

7. The structure of claim 6 wherein said grating reflector is oriented at an angle in a range of approximately 70°-85° relative to said first and second reflective means.

8. The structure of claim 1 wherein said grating reflector is characterized by a single dominant grating period.

9. The structure of claim 1 wherein said grating reflector extends over at least 90% of the length of the resonant cavity.

10. The structure of claim 9 further including at least one transparent window region adjacent to at least one of said first and second reflective means.

11. The structure of claim 1 further comprising a third reflective means disposed on one side of said grating reflector between said first and second reflective means and oriented substantially parallel to said grating reflector.

12. A coherent light generating structure comprising, at least one active region for generating lightwaves, excitation means for pumping at least a portion of said at least one active region, first and second reflective means for defining a resonant cavity therebetween, said pumped portion of said at least one active region disposed at least partially within said resonant cavity, and distributed reflective means disposed at an angle to said first and second reflective means within at least a portion of said resonant cavity for coherently diffracting at least a portion of a beam of said generated lightwaves along a path within said resonant cavity between said first and second reflective means, at least a portion of said path of said beam of generated lightwaves coinciding with at least a portion of said pumped portion of said at least one active region and at least a portion of said path of said beam of generated lightwaves being at least partially laterally directed at a nonperpendicular angle to said first and second reflective means, said distributed reflective means having a dominant periodicity and a characteristic orientation selected such that at least a specified wavelength of lightwaves generated by said active region is within a resonance bandwidth of said distributed reflective means for lightwaves incident thereon from a direction normal to said first and second reflective means.

13. The structure of claim 12 wherein said distributed reflective means comprises at least one set of parallel, periodically spaced, partial reflectors oriented at a nonperpendicular angle to said first and second reflective means.

14. The structure of claim 13 wherein said distributed reflective means are gratings of a type selected from the group consisting of etched grooves, periodic refractive index variations, antiguides, dielectric stacks, periodic gain distributions and periodic loss variations.

15. The structure of claim 13 wherein said at least one set of parallel, periodically spaced, partial reflectors incorporate at least one phase shift totaling one-quarter wavelength across said pumped portion of said active region.

16. The structure of claim 13 wherein said at least one set of partial reflectors are oriented at an angle of greater than 45° relative to said first and second reflective means, whereby lightwaves propagating in a direction normal to said first and second reflective means are incident on said at least one set of partial reflectors at a shallow incidence angle.

17. The structure of claim 16 wherein said at least one set of partial reflectors are oriented at an angle in a range of approximately 70-85° relative to said first and second reflective means.

18. The structure of claim 12 wherein said distributed reflective means is disposed only within said pumped portion of said at least one active region.

19. The structure of claim 12 wherein said distributed reflective means is disposed only outside said pumped portion of said at least one active region.

20. The structure of claim 12 wherein said distributed reflective means is disposed both within and outside of said pumped portion of said at least one active region.

21. The structure of claim 12 wherein said distributed reflective means extends the entire length of said resonant cavity from said first reflective means to said second reflective means.

22. The structure of claim 12 wherein said distributed reflective means extends over only a portion of the length of said resonant cavity, at least one end of said distributed reflective means optically coupled to a pumped gain portion of said active region extending over another portion of the length of said resonant cavity.

23. The structure of claim 12 wherein said pumped portion of said at least one active region is also disposed partially outside of said resonant cavity, the part of said pumped portion that is outside said resonant cavity being optically coupled to said resonant cavity to receive lightwaves therefrom, the part of said pumped portion that is outside said resonant cavity forming an optical amplifier for said lightwaves received thereby from said resonant cavity.

24. The structure of claim 12 wherein at least one of said first and second reflective means is a reflective facet.

25. The structure of claim 12 wherein at least one of said first and second reflective means is a distributed Bragg reflector.

26. The structure of claim 12 wherein said first and second reflective means are parallel to one another.

27. The structure of claim 12 wherein said second reflective means is oriented at an angle to said first reflective means.

28. The structure of claim 12 wherein at least one of said first and second reflective means is monolithically integrated with said active region and said distributed reflective means as parts of a unitary material body.

29. The structure of claim 12 wherein said first and second reflective means are external reflectors spaced apart from a unitary material body that includes said active region and said distributed reflective means.

30. The structure of claim 29 further including means for rotating said unitary material body about an axis perpendicular to said at least one active region so as to adjust said characteristic orientation of said distributed reflective means relative to said external reflectors, whereby said specified wavelength of said lightwaves is tunable.

31. The structure of claim 12 wherein said excitation means comprises means for injecting electrical current into selected portions of said at least one active region.

32. The structure of claim 12 wherein said pumped portion of said at least one active region forms at least one serpentine gain stripe.

33. The structure of claim 12 wherein said pumped portion of said at least one active region forms at least one linear gain stripe oriented at an angle other than perpendicular to said first and second reflective means.

34. The structure of claim 12 wherein said pumped portion of said at least one active region forms a flared gain stripe with a narrower first end and expanding in width to a broader second end of said flared gain stripe.

35. The structure of claim 12 wherein said pumped portion within said resonant cavity coincides with said path of said coherently diffracted beam of generated light-waves within said resonant cavity.

36. The structure of claim 12 wherein said excitation means provides a nonuniform pump distribution such that said pumped portion of said at least one active region includes at least two distinct regions with different levels of pumping.

37. The structure of claim 12 further comprising spatial mode filter means disposed between said first and second reflective means and optically coupled to an end of said distributed reflective means, for favoring oscillation of a single spatial mode of said lightwaves.

38. The structure of claim 37 wherein said spatial mode filter means is a single mode waveguide formed between said end of said distributed reflective means and one of said first and second reflective means in said path of said beam of generated lightwaves.

39. The structure of claim 12 further comprising non-transmissive means disposed within said resonant cavity for blocking lightwaves propagating in paths other than said path of said coherently diffracted beam of said generated lightwaves of said specified wavelength.

40. The structure of claim 12 further comprising means, optically coupled to said pumped portion of said at least one active region, for causing surface emission of said beam of generated lightwaves.

41. The structure of claim 40 wherein said surface emission means is selected from the group consisting of a second order tuned DBR grating, a detuned grating, and a 45° angled reflector oriented to direct light transversely relative to said active region.

42. The structure of claim 12 wherein said at least one active region, said excitation means, said first and second reflective means and said distributed reflective means further define a monolithic array of light emitters each having a beam of generated lightwaves propagating along a separate path in said resonant cavity, said structure further comprising means for optically coupling said separate paths of said beams such that light emitted from said monolithic array of light emitters has a coherent phase relationship across said array.

43. The structure of claim 42 wherein each light emitter in said array has a distributive reflective means characterized by a different characteristic dominant periodicity.

44. The structure of claim 42 wherein regions between adjacent light emitters in said array have separate means for biasing said active region to adjust the phase relationship between said light emitters.

45. A coherent light generating structure comprising,
at least one active region for generating lightwaves,
excitation means for pumping at least a portion of said at least one active region,
first and second reflective means spaced apart from one another for defining a resonant cavity therebetween, said pumped portion of said at least one active region disposed at least partially within said resonant cavity, and
one and only one broad-area grating reflector disposed within a portion of said resonant cavity, said grating reflector oriented at an angle of at least 45° relative to said first and second reflective means such that lightwaves propagating in a direction normal to said first and second reflective means are incident on said grating reflector at a shallow incidence angle and within a resonance bandwidth of said grating reflector for at least a specified wavelength of said lightwaves generated by said active region.

46. The structure of claim 45 wherein said first and second reflective means are parallel to one another.

47. The structure of claim 45 wherein said first and second reflective means are at an angle to one another.

48. The structure of claim 45 wherein said grating reflector is oriented at an angle in a range of approximately 70°-85° with respect to said first and second reflective means.

49. The structure of claim 45 wherein said portion of said active region pumped by said excitation means matches a mode shape for a beam of said lightwaves within said resonant cavity.

50. A coherent light generating structure comprising
at least one active region for generating lightwaves,
excitation means for pumping at least a portion of said at least one active region,
first and second reflective means spaced apart from one another for defining a resonant cavity therebetween, said pumped portion of said at least one active region disposed at least partially within said resonant cavity, and
one and only one broad area grating reflector disposed within a portion of said resonant cavity and oriented at an angle relative to said first and second reflective means for laterally diffracting at least a portion of a beam of said generated lightwaves along a serpentine path within said resonant cavity, lightwaves propagating along said serpentine path reversing direction only upon reflection by either of said first and second reflective means.

51. A semiconductor diode laser structure comprising
a semiconductor body having at least one active region therein for generating lightwaves,
means for injecting electrical current into at least one selected gain portion of said at least one active region so as to generate and amplify said lightwaves under lasing conditions,
a pair of reflectors of said lightwaves spaced apart from one another and defining a resonant optical cavity therebetween, at least part of said at least one selected gain portion being located within said resonant optical cavity between said pair of reflectors, and
at least one broad-area grating reflector disposed within at least a portion of said resonant optical cavity between said pair of reflectors and oriented at an angle to said pair of reflectors such that lightwaves incident upon said at least one grating reflector from a direction normal to said pair of reflectors are at least partially deflected in a lateral direction across said active region, said at least one grating reflector having a grating period selected such that at least a specified wavelength of said lightwaves lies within a resonance bandwidth of said at least one grating reflector for light incident thereupon from a direction normal to said pair of reflectors.

52. The structure of claim 51 wherein said at least one grating reflector is of a type selected from the group consisting of etched grooves, periodic refractive index variations, antiguides, dielectric stacks, periodic gain distributions and periodic loss distributions.

53. The structure of claim 51 wherein at least one of said pair of reflectors is a short DBR grating formed in said semiconductor body.

54. The structure of claim 51 wherein at least one of said pair of reflectors is a reflective facet of said semiconductor body.

55. The structure of claim 51 wherein at least one of said pair of reflectors is an external cavity reflector spaced apart from said semiconductor body.

56. The structure of claim 55 further comprising means for rotating said semiconductor body about an axis perpendicular to said active region relative to said pair of reflectors, both of said pair of reflectors being external cavity reflectors spaced apart from said semiconductor body, whereby said at least one broad-area grating reflector is orientable at an adjustable angle relative to said external cavity reflectors and whereby said specified wavelength of said lightwaves is tunable.

57. The structure of claim 51 wherein said pair of reflectors are parallel to one another.

58. The structure of claim 51 wherein said pair of reflectors are oriented at an angle to one another.

59. The structure of claim 51 wherein said at least one broad-area grating reflector is disposed only within said at least one selected gain portion of said at least one active region.

60. The structure of claim 51 wherein said at least one broad-area grating reflector is disposed only outside said at least one selected gain portion of said at least one active region.

61. The structure of claim 51 wherein at least one broad-area grating reflector is disposed both within and outside of said at least one selected gain portion of said at least one active region.

62. The structure of claim 51 wherein said at least one broad-area grating reflector incorporates at least one phase shift between adjacent sets of parallel, periodically spaced, partial reflectors making up said grating reflector.

63. The structure of claim 51 wherein said at least one broad-area grating reflector is oriented at an angle of greater than 45° relative to said pair of reflectors such that light propagating normal to said pair of reflectors is incident upon said grating reflector at a shallow angle of incidence.

64. The structure of claim 63 wherein said angle of incidence of light is in a range of approximately 70–85° from normal incidence.

65. The structure of claim 51 wherein said at least one broad-area grating reflector extends the entire length of said resonant optical cavity.

66. The structure of claim 51 wherein part of said at least one selected gain portion within said resonant optical cavity is optically coupled to an end of said at least one broad-area grating reflector.

67. The structure of claim 51 wherein said resonant optical cavity includes a spatial mode filtering structure therein at one end of said at least one broad-area grating reflector.

68. The structure of claim 67 wherein said spatial mode filtering structure includes at least one single spatial mode waveguide optically coupled to said end of said at least one broad-area grating reflector.

69. The structure of claim 51 wherein said at least one selected gain portion comprises at least one serpentine gain stripe.

70. The structure of claim 51 wherein said at least one selected gain portion comprises at least one stripe aligned at a nonperpendicular angle relative to said pair of reflectors.

71. The structure of claim 51 wherein said at least one selected gain portion is flared from a narrower end to a wider opposite end.

72. The structure of claim 51 wherein electrical current injecting means includes at least two conductive contacts on a surface of said semiconductor body, said selected gain portion receiving a nonuniform current distribution.

73. The structure of claim 72 wherein one of said pair of reflectors is a DBR grating, one conductive contact of said electrical current injecting means coinciding with said DBR grating for separately providing said DBR grating with electrical current injection.

74. A laser array structure comprising
at least one active region for generating lightwaves,
excitation means for pumping at least a portion of said at least one active region,
first and second reflective means spaced apart from one another for defining a resonant cavity therebetween, said pumped portion of said at least one active region disposed at least partially within said resonant cavity, and
a plurality of broad-area grating reflectors laterally disposed with respect to one another in an array within at least a portion of said resonant cavity, each grating reflector oriented at an angle of at least 45° relative to said first and second reflective means such that lightwaves propagating in a direction normal to said first and second reflective means are incident on one said grating reflector at a shallow incidence angle and within a resonance bandwidth of said grating reflector for at least a specified wavelength of said lightwaves generated by said active region.

75. The array structure of claim 74 wherein said excitation means independently pumps separate portions of said at least one active region corresponding to separate grating reflectors.

76. The array structure of claim 74 wherein each grating reflector is characterized by a separate grating period.

77. The array structure of claim 76 wherein said separate grating periods are arranged as a substantially continuous chirp across said array.

78. The array structure of claim 74 wherein said grating reflectors are laterally spaced apart from each other.

79. The array structure of claim 78 wherein regions between said laterally spaced apart grating reflectors are separately biased by phase adjusting means for controlling the relative phase of light laterally coupled from one grating reflector to an adjacent grating reflector of the array.

80. The array structure of claim 74 wherein light blocking regions are disposed between adjacent grating reflectors of the array.

81. The array structure of claim 80 wherein said light blocking regions extend over the entire length of the resonant cavity between said first and second reflective means.

82. The array structure of claim 80 wherein said light blocking regions extend only partially over the length of the resonant cavity between said first and second reflective means.

83. The array structure of claim 74 wherein said grating reflectors are oriented at an angle in a range of approximately 70° to 85° relative to said first and second reflective means.

84. A laser structure comprising
at least one active region for generating lightwaves,
excitation means for pumping at least a portion of said at least one active region, and
means for defining a resonant cavity, said pumped portion of said at least one active region disposed at least partially within said resonant cavity, said resonant cavity defining means including a first grating oriented for reflection of said generated lightwaves at normal incidence and a second grating oriented at an angle with respect to said first grating such that lightwaves incident on said second grating from a direction perpendicular to said first grating are laterally diffracted by said second grating.

85. The structure of claim 84 further comprising means for modulating an effective refractive index in a region of one of said first and second gratings for amplitude modulation of said lightwaves.

* * * * *